US011193904B2

(12) United States Patent
Carr

(10) Patent No.: US 11,193,904 B2
(45) Date of Patent: Dec. 7, 2021

(54) PIXEL FOR ANALYZING A GASEOUS ANALYTE

(71) Applicant: William N Carr, Cary, NC (US)

(72) Inventor: William N Carr, Cary, NC (US)

(*) Notice: Subject to any disclaimer, the term of this patent is extended or adjusted under 35 U.S.C. 154(b) by 0 days.

(21) Appl. No.: 16/540,184

(22) Filed: Aug. 14, 2019

(65) Prior Publication Data

US 2021/0123876 A1    Apr. 29, 2021

Related U.S. Application Data

(63) Continuation-in-part of application No. 16/221,500, filed on Dec. 15, 2018, now abandoned, which is a continuation-in-part of application No. 15/632,462, filed on Jun. 26, 2017, now abandoned, which is a continuation-in-part of application No. 15/624,625, filed on Jun. 15, 2017, now abandoned, application No. 16/540,184, which is a continuation-in-part of application No. 15/727,249, filed on Oct. 6, 2017, now abandoned, which is a continuation-in-part of application No. 15/083,286, filed on Mar. 29, 2016, now Pat. No. 9,722,165, which is a continuation-in-part of application No. 14/676,867, filed on Apr. 2, 2015, now Pat. No. 9,236,552, which is a continuation-in-part of application No. 14/245,598, filed on Apr. 4, 2014, now Pat. No. 9,006,857.

(60) Provisional application No. 61/808,461, filed on Apr. 4, 2013, provisional application No. 61/948,877, filed on Mar. 6, 2014.

(51) Int. Cl.

| G01N 27/18 | (2006.01) |
|---|---|
| G01N 27/12 | (2006.01) |
| G01N 25/18 | (2006.01) |
| H01L 35/32 | (2006.01) |
| H01L 27/16 | (2006.01) |
| H01L 35/28 | (2006.01) |

(52) U.S. Cl.
CPC .......... G01N 27/18 (2013.01); G01N 25/18 (2013.01); G01N 27/125 (2013.01); H01L 27/16 (2013.01); H01L 35/28 (2013.01); H01L 35/32 (2013.01)

(58) Field of Classification Search
CPC ...... G01N 27/18; G01N 27/125; G01N 25/18; H01L 35/32; H01L 27/16; H01L 35/28
See application file for complete search history.

(56) References Cited

U.S. PATENT DOCUMENTS 9,006,857 B1 * 4/2015 Carr .................. G01J 5/023
                                                257/469
9,817,130 B1 * 11/2017 Carr .................. G01T 1/248

* cited by examiner

*Primary Examiner* — Robert G Bachner
(74) *Attorney, Agent, or Firm* — Kaplan Breyer Schwarz, LLP

(57) ABSTRACT

A sensor for sensing a gaseous analyte comprising semiconductor phononic nanowire structure and a micro-platform. The sensor comprises a thermal element sensitive to temperature and involving variously chemi-resistive, absorptive and phase change effects. Sensor readout includes monitoring the temperature of the micro-platform.

19 Claims, 18 Drawing Sheets

PIXEL FOR ANALYZING A GASEOUS ANALYTE

STATEMENT OF RELATED CASES

This case is a continuation of U.S. patent application Ser. No. 15/727,249 filed on Oct. 6, 2017. This case is a continuation of U.S. patent application Ser. No. 16/221,500 filed Dec. 15, 2018, continued from U.S. patent application Ser. No. 15/632,462 filed Jun. 26, 2017, and with further continuation from U.S. patent application Ser. No. 15/624,625 filed Jun. 15, 2015. These cases are incorporated herein by reference.

If there are any contradictions or inconsistencies in language between this application and the cases that have been incorporated by reference that might affect the interpretation of the claims in this case, these related claims should be interpreted to be consistent with the language in this case.

FIELD OF THE INVENTION

This invention relates generally to a nanostructured sensor comprising thermal and phononic structure.

BACKGROUND OF THE INVENTION

Semiconductor structures adapted with micro- and nano-dimensions can be physically configured as sensors for thermal transport and electrical impedance sensing. This class of sensors comprises a technology known as thermally based sensing (TBS). Sensing of a gas or vapor analyte can be accomplished by monitoring a response of the analyte in a controlled or monitored temperature environment using thermal elements. TBS sensing of a gaseous analyte can involve monitoring a chemical or physical characteristic using any one of many transduction mechanisms. Some transduction mechanisms only present at elevated temperature. Analysis of an analyte based on thermal sensing can lead to more precise determinations when characteristics of the analyte are determined over a controlled range of temperature. Prior art for TBS-related analysis of gaseous analytes is primarily based on use of instruments that are not miniaturized with thermal elements having micro- and nano-dimensions.

Phononic structures have been demonstrated to reduce the thermal conductivity of thin slabs of material, especially crystalline thin films. Films of slab material physically configured with structure having reduced thermal conductivity is disclosed in the following prior art.

S. Mohammadi et all, *Appl. Phys. Lett., vol.* 92, (2008) 221905 discloses a silicon slab having 8 layers of phononic crystal (PnC) comprising a plurality structure wherein the transport of thermal phonons of a frequency within the phononic bandgap is blocked.

Olsson et al U.S. Pat. No. 7,836,566 (2010) discloses a microfabricated slab comprised of a multi-dimensional periodic array of phononic structures embedded in a silicon semiconductor matrix providing a phononic crystal (PnC) with a phononic bandgap.

Soliman et al *Appl. Phys. Lett., vol.* 97, (2010) 193502 discloses a slab of silicon comprised of solid pillars and plugs configured as PnCs to obtain phononic bandgaps, the bandgaps defining frequency bands wherein the propagation of acoustic waves is forbidden.

Ziaci-Moayyed et al, Proc. IEEE $24^{th}$ Conf on MEMS (2011), pp. 1377-1381 discloses a semiconductor thin film physically configured with Bragg-type and Mie-type PnC reflecting mirrors to reduce thermal conductivity. The periodic array of scattering inclusions in embodiments comprises 7-layers. The PnC design causes certain frequencies of the phononic thermal energy transport to be completely reflected by the PnC.

El-Kady et al, in U.S. Pat. No. 8,508,370 (2013) discloses a PnC slab configured to provide a phononic bandgap insulator that reduces thermal conductivity. The slab is comprised of a periodic array of scattering inclusions embedded in a host matrix. PnCs having a plurality of layers of PnC crystals are disclosed as both stacked layers and layers disposed side-by-side.

El-Kady et al in U.S. Pat. No. 8,094,023 (2012) discloses a PnC device comprised of a cascade of phononic crystal layers. In this device, the superposition of Mie phononic resonance response and a Bragg phononic condition response result in opening of phononic frequency gaps wherein phonons are forbidden to propagate.

Zhao et al in "Engineering the thermal conductivity along an individual silicon wire by selective helium ion irradiation," Nature Communications, vol. 8 (2017) 15919 disclose a Si-nanowire wherein thermal conductivity is reduced with He ion implanting at various positions along the length of the wire. The He ions create scattering sites within the wire which increases phononic scattering.

) Allen et al in U.S. Pat. No. 9,291,297 discloses a structure having a plurality of layers, each comprising photonic crystal (PnC), wherein each of the plurality of layers has a phononic bandgap wherein heat transporting phonons within a selected range of frequencies are substantially blocked by each of the PnC crystal layers. Embodiments include a thermal heatpipe conducting heat away from a hot gas turbine. PhC structure providing mechanical support for sensor transduction elements and within an integrated pixel structure 2 is not disclosed.

Hussein in U.S. Pat. No. 10,283,689 discloses a method for reducing thermal conductivity generating a plurality of local vibration modes by oscillation of at least one atom within atomically disordered material. Structure providing mechanical support for sensor transduction elements and within an integrated pixel is not disclosed.

Nasiri and Clark in "Nanostructured Chemiresistive Gas Sensors for Medical Applications", Sensors 2019, 19, pp. 462; doi.org/10.3390/s19030462. disclose a matrix of MOS-based chemiresistive sensors, operated in an oven at temperatures as high as 350° C., for analyzing a matrix of components in human breath having concentrations ranging from several ppb to several ppm. Applications include diagnosing and treatment planning for specific diseases, especially in the analysis of expired breath.

A micro-platform operated as a sensor with increased thermal isolation from a surrounding support platform is disclosed by Carr in U.S. Pat. Nos. 9,236,552, 9,722,165 and 10,008,373. In '165 a sensor is suspended by phononic nanowires to provide a thermal sensing micro-platform further comprising an impedance spectrometer wherein coupling with an analyte is resistive, electric, magnetic, or electromagnetic. Supporting structure for a micro-platform is disclosed wherein the ratio of electrical conductivity to thermal conductivity along the length of a suspension phononic nanowire is increased.

SUMMARY OF THE INVENTION

The present invention provides a pixel for thermal transport and electrical impedance sensing based on at least one thermal element disposed within a pixel comprising a substrate, cavity, micro-platform and phononic nanowires.

This invention provides a sensor pixel for a gaseous analyte with advantages over prior art including improved performance and functionality, low cost manufacturing, small size and ease of miniaturization, flexibility in mass production, simple operation and compatibility with nanotechnology foundry tools. The miniaturized embodiments of these sensors involving sensing or control of a transduction mechanism have improved figures of merit when the transduction structure is disposed on a micro-platform, wherein temperature and electrical resistance can be very efficiently and effectively controlled and monitored.

The invention is an apparatus that, in embodiments, includes a pixel comprising:

An apparatus comprising a pixel for thermal transport and/or electrical impedance sensing, wherein the pixel comprises:
  a substrate having a substantially planar surface;
  a cavity formed from the substrate;
  a micro-platform comprising at least one thermal element, the micro-platform disposed within the cavity, the micro-platform suspended by nanowires, the nanowires suspended from the substrate, and further wherein:
  one or more of the nanowires is comprised of a first layer, the first layer comprised of scattering phononic structure and/or resonant phononic structure, wherein the scattering phononic structure and/or resonant phononic structure reduces thermal conductivity in the first layer;
  the first layer is further comprised of a semiconductor, wherein the semiconductor provides electrical conductivity in the first layer;
  the micro-platform and the nanowires are disposed substantially within the same plane;
  the scattering phononic structure comprises random or periodic array of scattering sites (SS), the scattering sites separated by distances less than the mean-free-path of heat-conducting phonons;
  the resonant phononic structure comprises phononic crystal (PnC),
    wherein the PnC comprises a periodically-patterned array having a phononic bandgap, the phononic bandgap impedes the movement of heat transporting phonons within a range of frequencies;
  the at least one thermal element comprises one or more of an active thermal element, a passive thermal element and a hybrid thermal element; and
  the at least one thermal element, upon exposure to a gaseous analyte, is affected by a physical characteristic or chemical characteristic of the gaseous analyte.

The present invention provides an apparatus having embodiments that are based on a thermally-isolated micro-platform comprising one or more thermal elements exposed to a gaseous analyte.

A pixel may be adapted to include a plurality of cavities, micro-platforms, and thermal elements. For example, the substrate may comprise multiple cavities, each cavity comprising multiple micro-platforms, and each micro-platform comprising multiple elements. The pixel adapted in these structural formats is operated to provide any of a variety of sensors.

Thermal transduction mechanisms enabled with operation of the pixel within the apparatus typically include sensing small changes in signal voltage obtained when the pixel is exposed to a gaseous analyte. Transduction mechanisms involving the micro-platform exposed to a gaseous analyte are based on (1) sensing the rate of thermal transport into the exposed analyte as it affects the temperature of the micro-platform, (2) sensing the rate of thermal transport from the heated micro-platform through the analyte and into a temperature sensor element, (3) sensing temperature of the micro-platform wherein the micro-platform itself initiates an exothermic chemical reaction with the analyte, or (4) a physical or chemical reaction within the micro-platform in response to adsorption from exposure with the analyte.

In embodiments, other thermal transduction mechanisms are based on sensing the heat of fusion of the analyte (as in freezing water), sensing the effect of an exothermal oxidative reaction (as in a type 1 and type 2 palladium pellistor), and sensing the effect of analyte adsorption with accompanying chemical or physical reaction within the sensing thermal element (as in a chemi-resistive sensor, type 3 pellistor or chemFET).

In embodiments, the temperature of the micro-platform can be heated with a resistive heater, or cooled with a Peltier thermoelectric cooler. In applications, it is advantageous to determine thermal characteristics of the gas or vapor analyte at a controlled temperature, at multiple temperatures. In other embodiments the transduction mechanism involves cycling temperature of the micro-platform over a temperature range.

The pixel of this invention, in embodiments, is operated to determine a specific physical characteristic and chemical characteristic of the analyte including identification and monitoring of the characteristic over time.

In embodiments, the pixel comprises:
  a micro-platform having controlled lateral surface dimensions typically 1 um to 1 mm;
  a single micro-platform disposed within a cavity, the single micro-platform comprising one or more thermal elements;
  a plurality of micro-platforms, wherein each micro-platform comprises one or more thermal elements;
  supporting nanowires having a length, typically ranging from typically 10 um to 1,000 um;
  supporting nanowires having a thickness typically 5 nm to 1 um;
  thermal elements disposed on the micro-platform cavity separated with distances typically ranging from 100 to 500 microns; and
  the thermal elements comprising one or more of a thermocouple device, thermistor or bolometer, nanotubes or graphene, chemiresistor, chemFET, bandgap diode, MOS transistor and bipolar transistor.

In embodiments, the micro-platform comprises thermal elements characterized as active, passive or hybrid types. In these embodiments, the hybrid thermal element combines the function of an active thermal element and a passive thermal element into a single physical structure. For example, a chemiresistive sensor and a type 2 pellistor are hybrid thermal elements.

An active thermal element provides heat for the sensing transduction mechanism. An active thermal element may be primarily heated or cooled with power received from an external electric power source or from spontaneous heat generated by an adsorptive physical or chemical reaction. Examples of the active thermal element include a resistive heater, a Peltier thermoelectric cooler and type 1, 2 and 3 pellistors. In embodiments wherein the resistive heater is silicon semiconductor, the thermal element is powered to temperatures as high as 500° C. for stable operation.

In embodiments, wherein the active thermal element is a Peltier thermoelectric cooling device, an electric current of appropriate polarity is supplied from an external source, both types of charge carriers move away from junctions disposed in the micro-platform, convey heat away, thus cooling the micro-platform. Any thermoelectric device, including the Peltier thermoelectric device, can be operated to, for example, and without limitation, (1) provide a means of dynamic real-time control of the micro-platform temperature and temperature of analyte exposed to the micro-platform, (2) reduce Johnson kTRΔf noise inherent in the resistance R within temperature sensors disposed on the micro-platform, as in a thermistor, and (3) cause the analyte to change a physical property substantially, as in freezing to ice.

In the type 1 pellistor embodiment, an ALD of palladium or palladium alloy is heated from an external power source to a temperature wherein a flammable component of an exposed gaseous analyte burns (oxidizes) in an exothermic chemical reaction. Temperature of the micro-platform comprising the ALD palladium is monitored by a separate temperature sensing thermal element, typically a thermistor or Seebeck thermoelectric device.

In another embodiment, the active thermal element is a type 3 pellistor. The type 3 pellistor is not heated from an external power source, but instead is spontaneously heated internally wherein adsorbed hydrogen from the exposed analyte causes a phase change within a Pd metal film. Temperature is sensed by a passive thermal element, typically a Seebeck thermoelectric device. Both thermal elements are disposed on the same micro-platform.

A second type of thermal element is the passive thermal element. A passive thermal element is a sensor, providing a signal in response to temperature of a micro-platform, and wherein electrical power supplied from an external source is minimal or zero.

Passive thermal elements may comprise a thermistor or bolometer, nanotubes or graphene, bandgap diode, MOS transistor and bipolar transistor. These passive thermal elements are interrogated with an external low-power current or voltage source and readout in the form of a signal current or voltage provided by the thermal element. A thermistor is generally interrogated with a current source and readout is provided in the form of a signal voltage. A diode-connected MOS transistor operated in the subthreshold bias region is a temperature sensor typically interrogated with a current source. A pn junction bandgap diode operated with an interrogating forward bias current source has a terminal voltage proportional to absolute temperature (VPAT). A bipolar transistor operated with a fixed base-emitter voltage has collector current proportional to absolute temperature (IPAT). The passive thermal element also may comprise a mesh of nanotubes or graphene operated as a thermistor. In these passive embodiments, electrical resistance of the thermal element is affected by exposure of the micro-platform to the gaseous analyte.

In other embodiments, the passive thermal element comprises a Seebeck thermoelectric device which does not require an external interrogating power source. The thermoelectric device operating in the Seebeck mode responds to a temperature differential between the substrate and the micro-platform and creates a voltage. The Seebeck thermoelectric device provides a highly sensitive sensor for micro-platform temperature wherein readout is obtained at a low power level.

A Seebeck thermoelectric device is comprised of one or more pairs of junctions, the junctions connected at the ends of nanowires, wherein half of the junctions are disposed on the micro-platform and the other half of the junctions are disposed on the substrate. The sensor signal provided by the Seebeck thermoelectric device is further connected in known fashion into associated signal conditioning circuits. The sensor signal ranges from nanovolts into the millivolt range for a Seebeck thermoelectric device having two junctions.

A thermoelectric device operated as a Seebeck sensor can also be operated as a Peltier cooler because the thermoelectric effect is a thermodynamic-reversible effect. When the polarity of the electrical source powering a Peltier cooler is reversed, the same structure becomes a resistive heater.

A thermistor or bolometer is a resistive sensor wherein electrical resistance affected by temperature. This thermal element is operated with an interrogating current, and readout is obtained by sensing the voltage across the thermistor or bolometer. The thermistor or bolometer may comprise a semiconductor resistor or an ALD metal film. The thermistor or bolometer may comprise nanotubes or graphene further comprising, without limitation, one or more of carbon, $Cu_2O$, $SnO_2$, and $WO_3$.

An MOS transistor comprising a passive thermal element is connected as a two-terminal device and biased for operation in the sub-threshold voltage region. Another example of a passive thermal element is a pn junction bandgap diode operated with a forward bias current source, wherein the diode terminal voltage is proportional to absolute temperature (VPAT). In another embodiment, a bipolar transistor operated with a fixed base-emitter voltage has collector current proportional to absolute temperature (IPAT).

In embodiments, the passive thermal element is a chem-FET comprising a diode-connected MOSFET wherein a component of the exposed gas or vapor analyte is catalytically converted to atomic hydrogen (Ha) thereby creating a charge dipole of charge within or on the gate dielectric of an MOSFET transistor. In the chem-FET sensor embodiment, the conductance of the MOSFET channel is affected upon exposure to the analyte.

A passive thermal element may be disposed on the substrate to provide a reference temperature for calibration purposes and real time environmental temperature sensing. A passive thermal element disposed on the substrate is typically a thermistor or bandgap pn junction.

A third type of thermal element is the hybrid thermal element, operated at a substantial elevated temperature, and powered from an external source. Readout from this thermal element is obtained by operating as a bolometer wherein electrical resistance of the hybrid thermal element is sensitive to a component of the gaseous analyte. The hybrid thermal element is typically heated with a current source, and incremental changes in resistance result in incremental changes in signal voltage.

In embodiments, the chemi-resistive sensor is operated as a hybrid thermal element. Heater temperature is generally 100° C. and higher. In embodiments, the chemi-resistive sensor comprises an activation material, wherein electrical resistance changes incrementally upon exposure to the gaseous the analyte. The activation material comprises a catalyst adding increased sensing sensitivity.

The activation material within the chemi-resistive sensor is selected from a group, without limitation, comprising one or more of $In_2O_3$, $CeO_3$, $Cu_xO$, $ZnO_x$, $MoO_3$, $MoS_2$, $In_2O_3$, CdS, $SnO_2$, $WO_3$, NiO, and $In_xSn_yO_2$ wherein, without limitation, the catalyst is selected from a group comprised of one or more of Pd, Pt and Ag.

Another example of the hybrid active thermal element is the type 2 pellistor comprising a resistive heater, initiating an oxidative, exothermic thermal reaction with a flammable component of the analyte, wherein readout is obtained by sensing the voltage across the heater as in a bolometer. The pellistor typically comprises an ALD film of palladium wherein the exothermic reaction at elevated temperature. Sensitivity is enhanced by an additional increase of temperature from an adsorptive chemical reaction within the pellistor film. Pellistors are used to detect a flammable component including hydrogen within a gas or vapor analyte. The type 2 pellistor comprises a single thermal element.

In embodiments, the chemi-resistive sensor is selectively sensitive to the gas or vapor analyte comprising one or more of $H_2$, $H_2O$, $Cl_2$, CO, $CO_2$, $NH_3$, $CH_4$, $H_2S$, NO, $NO_2$, $BBr_3$, $H_2O_2$, $O_3$, $SiH_4$ and volatile organic compounds.

In some embodiments, temperature of the chemiresistive sensor and pellistor is monitored by a separate thermal element disposed on the same micro-platform. In such embodiments, the chemiresitive sensor and pellistor are operated as an active thermal element.

In an embodiment, the chemFET is operated as a hybrid thermal element wherein the micro-platform is resistively-heated to provide a reset function. The chemFET is generally operated at room temperature. The gate charge level, following a series of sensing operations, is reset to a reference level by powering the active heating element disposed on the micro-platform to an elevated temperature. In some embodiments, adsorption into the gate is enhanced by heating of the micro-platform.

Any of the thermal elements, including the resistive heater, may comprise structure that includes an ALD metal film further comprising one or more of Cu, W, NiCr, Pd, Ti, Pt, Mo, Co and Al. For some metal films an ALD adhesion enhancer such as Ti or Cr is used.

In embodiments, a thermal element provides a reference function wherein structure of reference thermal element is not sensitive upon exposure to a gaseous analyte. For example, a chemi-resistive sensor providing a reference function is formed without the activation material and is thus insensitive to the exposed analyte.

Referring now to the nanowires:

All embodiments of the present invention, one or more of the nanowires is comprised of a first layer. The first layer is comprised of a semiconductor which provides thermal conductivity the first layer. The first layer comprises scattering phononic structure and/or resonant phononic structure. This structure reduces the thermal conductivity of the first layer along its length. In nanowire embodiments of this invention, the mechanisms effecting thermal transport along the length of the first layer boundary scattering including reflections and resonance processes. For nanowires wherein the phononic structures are separated by as much as 100 nm, Umklapp scattering is not significant. In embodiments, a reduction in thermal conductivity provided by specific phononic structure may involve both scattering and resonance phononic phenomena.

In embodiments, both surface structure and internal structure comprising phononic structure can exert a significant influence on boundary scattering and reduce thermal conductivity. In embodiments, these phononic structures take the form of physical defects in the crystalline structure of the semiconductor nanowire. These phononic structures may be created in a variety of ways and may take on many forms.

Phononic structures, providing a reduction of thermal conductivity, can be designed and understood with science based on the duality principle in quantum mechanics which stipulates that a phonon can exhibit both wave- and particle-like properties at nano-scale.

Phononic scattering structures within the nanowire may comprise implanted atomic species. In other embodiments, phononic structuring comprising holes are disposed at random or within a periodic array format within a nanowire. Within phononic scattering structure, the effective mean free path for heat conducting phonons is dependent on the particle-like relaxation time due to multiple scattering of the corpuscular phonons at atomic scale. Phononic scattering sites separated by distances less than the mean-free-path of heat conducting phonons reduce thermal conductivity of the first layer. Thin films of semiconductor have been physically configured to provide a phononic crystal insulator with a quantum mechanical phononic bandgap (see for example, S. Mohammadi et all, *Appl. Phys. Lett.*, vol. 92, (2008) 221905). In some embodiments, wherein thermal conductivity of a nanowire is reduced, an array of phononic structures disposed within or on the surface of a nanowire, provide layers of phononic crystal (PnC). Phononic crystal structuring requires a periodic array of structures such as holes which exhibit elastic (phonon) band gaps. Quantum mechanical designed phononic bandgaps of PnCs define frequency bands where the propagation of heat-conducting phonons is forbidden.

PnC structure within the first layer is obtained by physically configuring the nanowire to reduce the phononic Brillouin zone and in some embodiments extend the effective scattering distance beyond the actual physical separation of structural defects comprising the PnC. The first layer, configured with PnC structures, can enhance both incoherent and coherent scattering of heat conducting phonons. PnC structures can comprise Bragg and/or Mie resonant structures.

In embodiments, the first layer comprises Bragg resonant structures, wherein phonon transport between adjacent and nearby periodically arrayed structures is restricted. In embodiments, Bragg resonant structures can be created in silicon nanowires by implanting elements such as Ar and Ge. In embodiments, Mie resonant structures comprise phonon transport within structures, further comprising including holes, indentations and cavities within the first nanowire layer. (see M. Ziaci-Moayyed, et al "Phononic Crystal Cavities for Micromechanical Resonators", Proc. IEEE $24^{th}$ Intl Conf. on MEMS, pp. 1377-1381, (2011).

The dimensions of scattering and resonant phononic structures are configured to not limit the scattering range for electrons and thereby have minimal effect on bulk electrical conductivity of the nanowire. In this invention, a first nanowire layer is comprised of a semiconductor where the difference in mean free path (mfp) for phonons and electrons is significant. Typically, in embodiments, the semiconductor material of semiconductor nanowires will have electron mean free paths ranging from less than 1 nm up to a maximum of 10 nm. The mean free path for phonons that dominate the thermal transport within the nanowire of the present invention is within the range 20 to 2000 nm, significantly larger than for electrons. In embodiments, the distance between phononic structural elements is engineered to be greater than 10 nm.

Phononic structuring of a first layer of nanowires reduces thermal conductivity and has less effect on the electrical conductivity. In this invention, the phononic structure of the first layer decreases the ratio of thermal conductivity to electrical conductivity within the first layer.

In embodiments, the desired scattering phononic and/or resonant phononic structures may be created as an array comprising randomly or periodically disposed holes, pillars, plugs, cavities, indentations, surface structures, implanted elemental species, and embedded particulates.

In some embodiments, the first layer is created based on an electrochemical or multisource evaporation process for a semiconductor film deposition and subsequent annealing to provide a porous or particulate-structured film. One process providing a random phononic structure is a metalo-etch process which involves a reaction with a metal component in the etchant. In other embodiments, the first layer is selectively ion implanted with a species such as Ar to provide random scattering phononic structures. Processes for the synthesis of thin films of nanometer thickness with porous, particulate or surface structures, both with and without lithography, is well known to those familiar with the art.

In embodiments, the one or more nanowires comprised of a first layer is further comprised of a second layer. This second layer is an ALD metal of nanometer thickness typically selected from a group including Pt, W, Pd, Cu, Ti, NiCr, Co, Mo and Al providing an increased electrical conductivity. The second layer may be patterned as a film continuing beyond the ends of the nanowire and onto the micro-platform and substrate. In embodiments, the second layer of metal connects further onto the micro-platform to provide an electrical connection. In embodiments, the second layer may extend into the micro-platform to provide a resistive heater or chemiresistive sensor.

In embodiments, the one or more nanowires comprised of a first layer is further comprised of a third layer of ALD dielectric. The third layer may extend beyond the nanowire and over the micro-platform providing a biaxial compensating stress, often a tensile stress, to reduce overall stress across the micro-platform. In embodiments, the third layer may be disposed directly on the first layer. In embodiments, the third layer of dielectric material may be disposed between the first and second layers. In embodiments, the third layer may be disposed over a second layer. In embodiments, the third layer may be a passivating layer protecting underlying structure during wafer processing. The third layer comprises a dielectric typically selected from one or more of silicon nitride, silicon dioxide, silicon oxynitride, and aluminum oxide.

In embodiments, thermal elements or internal portions of a thermal element are electrically isolated from an underlying semiconductor layer with a dielectric film. In other embodiments, thermal elements or internal portions of a thermal element comprise a heavily doped layer, diffused into an underlying high resistivity semiconductor. An exemplary example of isolation based on a high-resistivity foundation layer is a Seebeck thermoelectric device comprising heavily doped p+ and n− layers diffused into the active layer of an SOI silicon wafer, wherein the thermoelectric junctions are electrically isolated by high resistivity of the foundation layer (such as silicon having 5,000 Ω-cm resistivity). In other embodiments, electrical isolation between thermal elements disposed on the same micro-platform is provided by an electrostatic, metallic ALD shield.

In the exemplary embodiments of this invention, the starting wafer is a silicon sandwich structured as a semiconductor-on-insulator (SOI) wafer. The SOI wafer is comprised of a first semiconductor device layer of appropriate electrical conductivity, a sandwiched silicon dioxide film (BOX) of low electrical conductivity, and an underlying silicon handle substrate. The SOI starting wafer is typically manufactured by processes such as BESOI and SMART-CUT™. The SOI wafer is processed using industry semiconductor manufacturing wafer processes and processing tools including CVD, MOCVD, PVD including co-evaporation, RTP, RIE, DRIE, HF-vapor etch, annealing/diffusion furnaces, ion implantation, deep submicron EBL and lithography steppers familiar to those of ordinary skill in the art.

In embodiments, nanowires are physically configured with phononic structure created by submicron patterning of the active layer of a silicon SOI starting wafer. In some embodiments, nanowires are physically configured as nano-films synthesized by depositions including sol gel and multi-source evaporation processes. These synthesis processes use appropriate precursors and specialized thermal annealing to form nanowires with mesoporous or clustered phononic scattering structures known to those skilled in the art.

A near final processing step is to create the cavity under the micro-platform and nanowires. This release is accomplished using a backside or frontside etch. Creation of the cavity from the backside is accomplished using a patterned etch comprising plasma DRIE or an anisotropic liquid etch comprising EDP, TMAH, KOH, or hydrazine. In embodiments, release from the topside is obtained using a combination etch comprising DRIE and vapor HF. For release from the topside, nanowires and the micro-platform are passivated against the etchant with a patterned thin film typically of silicon nitride, chromium or a polymer resist as appropriate.

In embodiments, the cavity is exposed to the gaseous analyte directly or through a porous baffle structure comprising a micro-filter. The baffle structure may comprise an overlying porous ceramic or porous semiconductor bonded to the substrate. The baffle structure shields the cavities within the pixel from environmental particulates and most liquids and is transparent to molecular components of the gaseous analyte. The porous filter protects the nanowires and micro-platform from damage and unwanted accumulations of particulates carried by the analyte.

Processing of the pixel active silicon layer may include fabrication of integrated circuits, especially CMOS circuits, disposed on or off the micro-platform. Other final process steps in pixel fabrication may include growth or placement of sheet graphene and nanotubes of selected materials, including carbon nanotubes in various formats, onto the micro-platform to provide a bolometer or chemi-resistive sensor.

In some embodiments, signal conditioning, processing and control circuits are disposed on the substrate, and in other embodiments these circuits are located external to the pixel. These circuits typically comprise one or more of a voltmeter, ammeter, ohmmeter, constant current source, constant voltage source, potentiostat, and a full- or half-Wheatstone bridge. In embodiments comprising an array of platforms on a substrate, circuits external to the thermal elements are provided for row and column select and signal readout.

Specialized wafer handler cassettes, designed to protect wafers with fragile micro-platform structures are used as necessary. To package the pixel after it is processed at wafer scale, dicing techniques are used which do not damage the micro-platform and nanowire. For example, dicing can be performed using a $CO_2$ laser scribe operated to minimize ablation.

A method for analyzing a gaseous analyte based on the apparatus of claim 1, wherein the method comprises the following sequenced operations:
  operating the apparatus with a known gaseous analyte having a known physical or chemical characteristic to obtain a reference database, the reference database comprised of calibration signal levels obtained from the one or more sensor thermal elements;

creating a multivariate algorithm based on the reference database wherein the multivariate algorithm provides a means of calculating the physical or chemical characteristic based on arbitrary signal levels obtained from the one or more sensor thermal elements;

operating the apparatus with a gaseous analyte wherein the physical or chemical characteristic of interest is unknown;

creating a signal database comprising signal levels from the one or more sensor thermal elements, and processing the signal database using the multivariate algorithm to determine the physical or chemical characteristic of interest for the unknown analyte of interest.

There is a need for gas and vapor sensors physically configured with dimensions at microscale and nanoscale providing further advantages of increased sensitivity, additional dynamic range, differentiation for multiple analytes, reduced footprint size, reduced power consumption, and miniaturization. In some embodiments, the pixel is adapted with dual micro-platform structure, wherein separate micro-platforms comprise identical thermal elements, providing a redundancy to enhance an overall reliability or measurement accuracy.

DETAIL DESCRIPTION

Figure 1A:
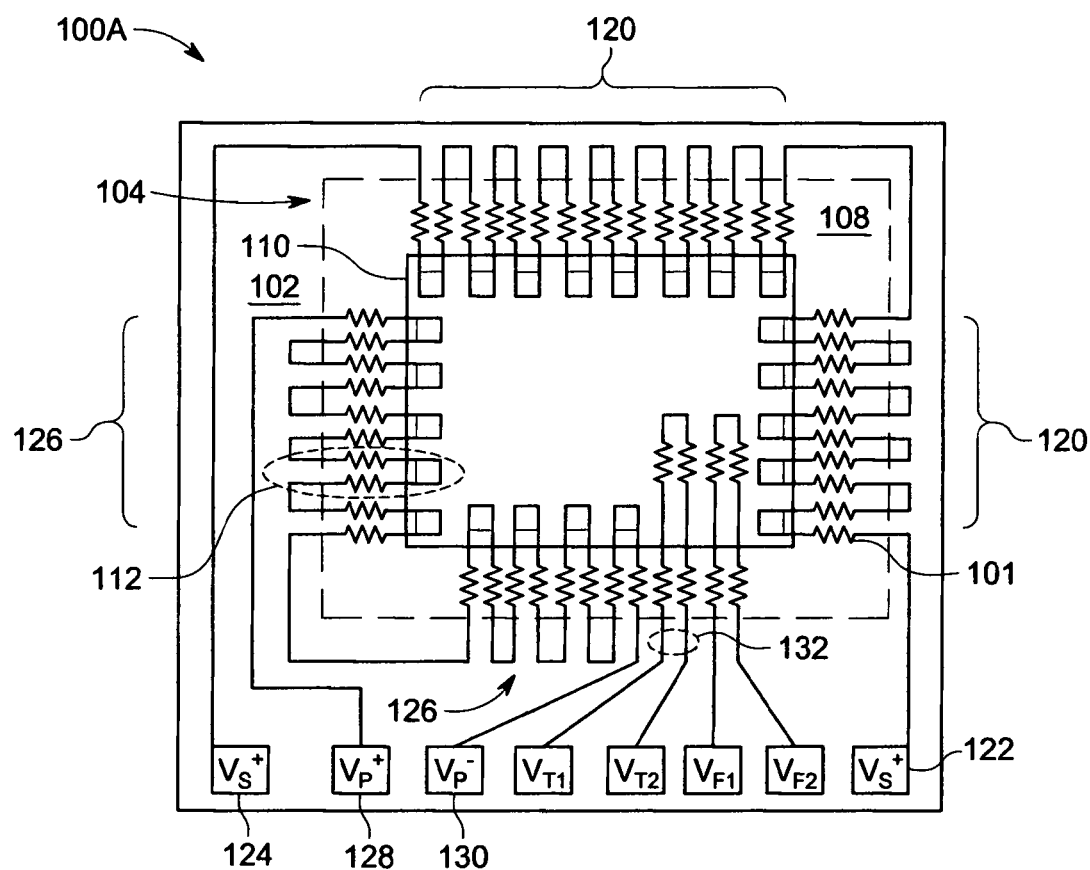
FIG. 1A depicts a plan view of a prior art micro-platform.
Figure 1B:
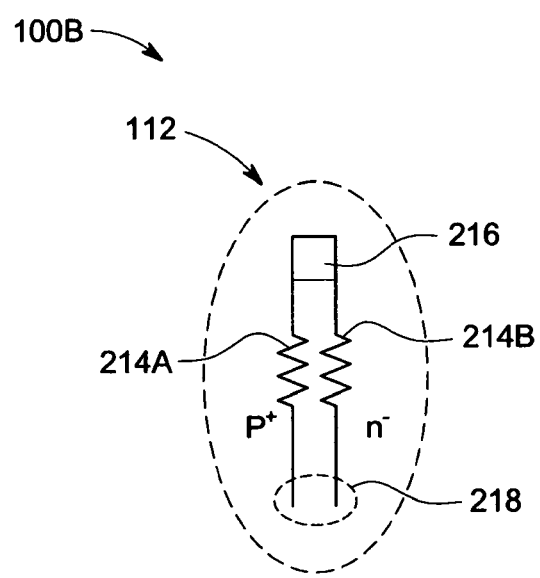
FIG. 1B depicts two nanowires comprising a prior art thermoelectric element.

Definitions: The following terms as explicitly defined for use in this disclosure and the appended claims:

"analyte" means a gas or vapor of interest exposed to the sensing structure of a thermal pixel.

"Pirani gauge" means a pressure sensor based on sensing thermal transport dissipating into a gaseous analyte.

"Non-dissipative thermal-mass flow sensor" means a sensor wherein transduction is based on heat transported between thermal elements due to movement of a gaseous analyte.

"chemi-resistive sensor" means a sensor wherein the primary means of transduction is a chemical reaction effecting changes in the electrical impedance of a thermal element exposed to a gaseous analyte and wherein thermal transport dissipates into a gaseous analyte.

"chem-FET" means an MOSFET device physically adapted as a sensor wherein gate charge is acquired, modulating electrical conductance of the channel, upon exposure to a gaseous analyte.

"pellistor" means a sensor detecting flammable components of a gaseous analyte.

"capnometer" means a biomedical sensor for measuring $CO_2$ in expired breath.

"spirometer" means a biomedical sensor for measuring the rate of air entering and leaving the lungs.

"nm, um, and mm" as dimensional limiters mean nanometers, micrometers or microns, and millimeters, respectively.

"disposed on" means a structure physically positioned on or created within. For instance, a resistive thermistor element "disposed on" a micro-platform may be physically bonded to the micro-platform or it may be a diffused structure created within the micro-platform.

In the drawings depicting embodiments of this invention, it is understood that portions of the substrate surround nanowire junctions and interconnects may not be detailed. Areas of the pixel not illustrated may be further processed to electrically-isolate active and passive thermal elements from adjacent areas of layer 102. Selected areas may, for example, be further comprised of patterned silicon nitride to facilitate topside release of a micro-platform. These films and areas are not explicitly identified in all drawings.

FIG. 1A depicts a plan view of a prior art thermoelectric sensor 100A. The prior art pixel disclosed is comprised of a micro-platform 110 with supporting semiconductor nanowires 101 disposed over a cavity 108 wherein the cavity is bounded by perimeter 104. The nanowires 101 supporting the micro-platform 110 extend from the surrounding substrate 102. Nanowire 101 is terminated on the micro-platform 110 and the surrounding substrate 102. The pixel is comprised of thermoelectric elements 112 connected electrically in series. The connection 132 depicts circuit connections to structures including thermistor resistors and integrated circuits disposed in or on the micro-platform 110. A first series-connected array 120 of thermoelectric devices 112 is disposed on micro-platform 110 with connections through nanowires 101 to off-platform bonding pads 122 and 124. A second series-connected array 126 of thermoelectric devices 112 is disposed on the platform 110 with a connection through nanowires to bonding pads 128 and 130.

Figure 2A:
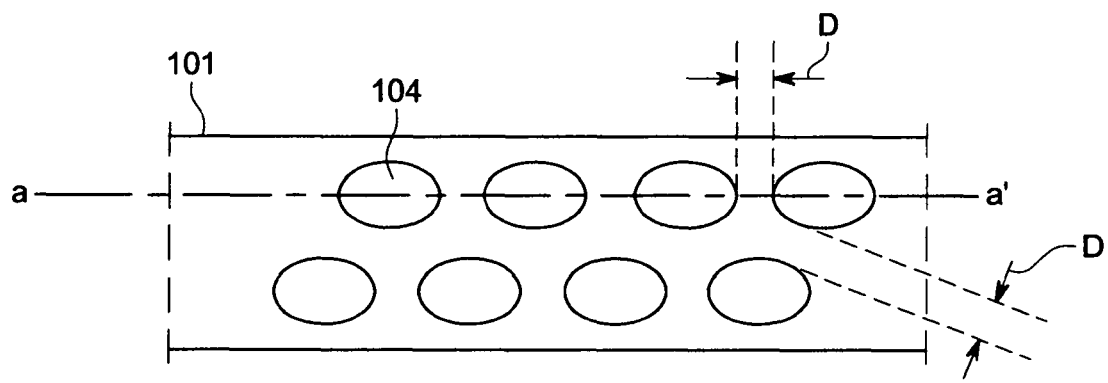
FIG. 2A depicts a plan view of a prior art nanowire with exemplary phononic structure.
Figure 2B:
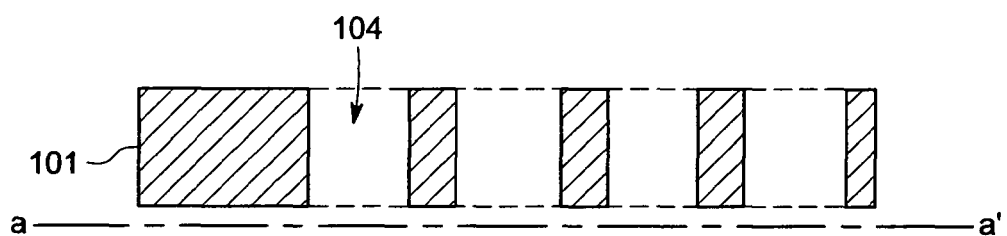
FIG. 2B depicts a cross-sectional view of a prior art nanowire with exemplary phononic structure.
Figure 3:
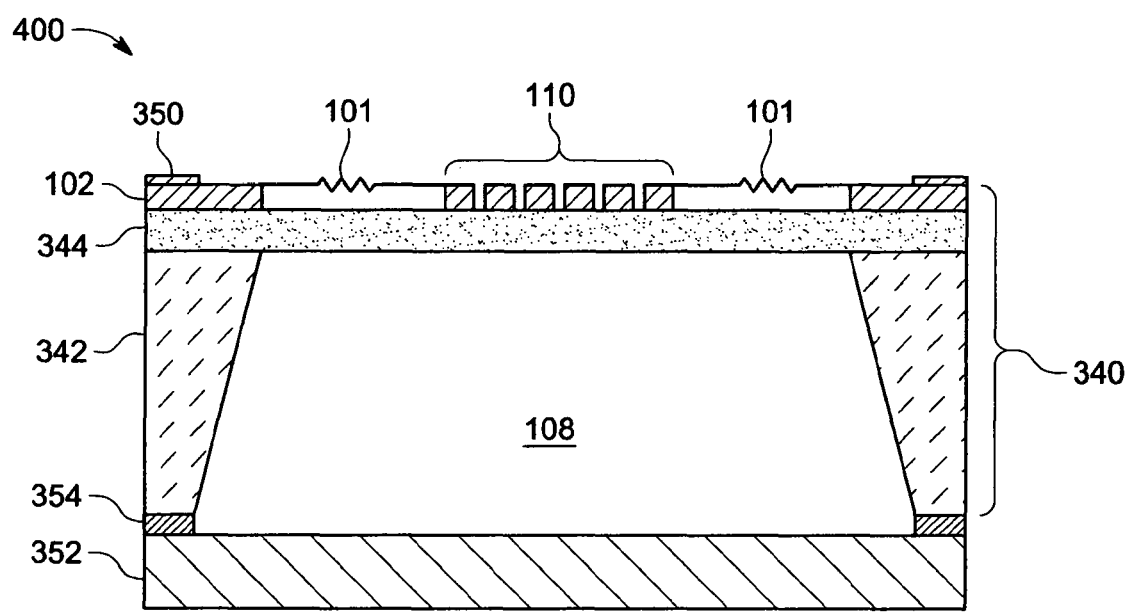
FIG. 3 depicts a cross-sectional view of a prior art micro-platform and supporting nanowires released with backside etching.
Figure 4:
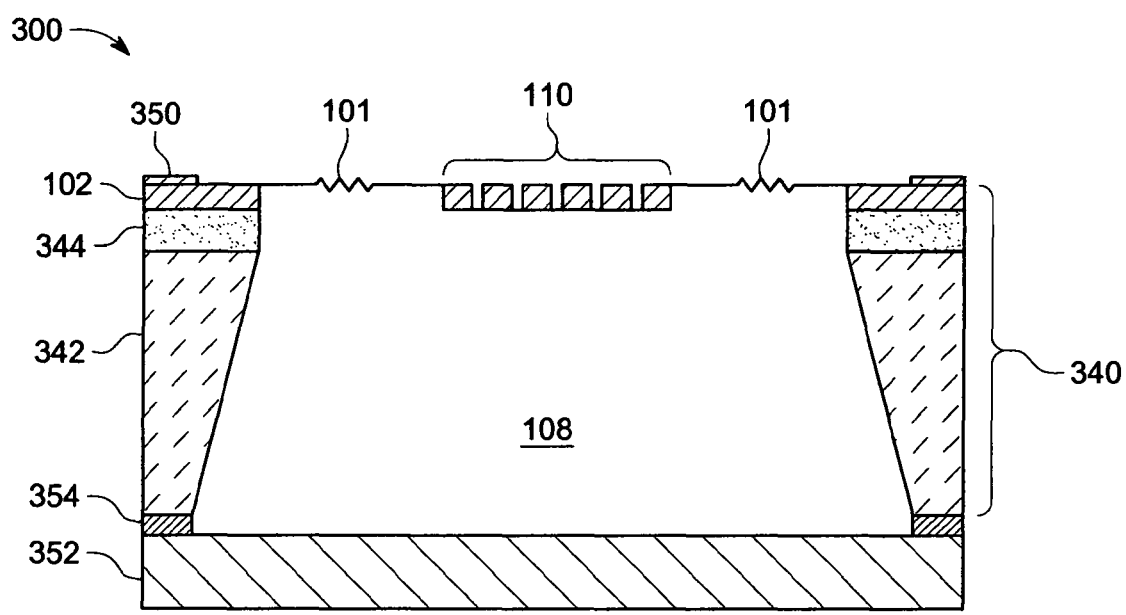
FIG. 4 depicts a cross-sectional view of a prior art micro-platform with nanowires and underlying dielectric film support released with backside etch.
Figure 5:
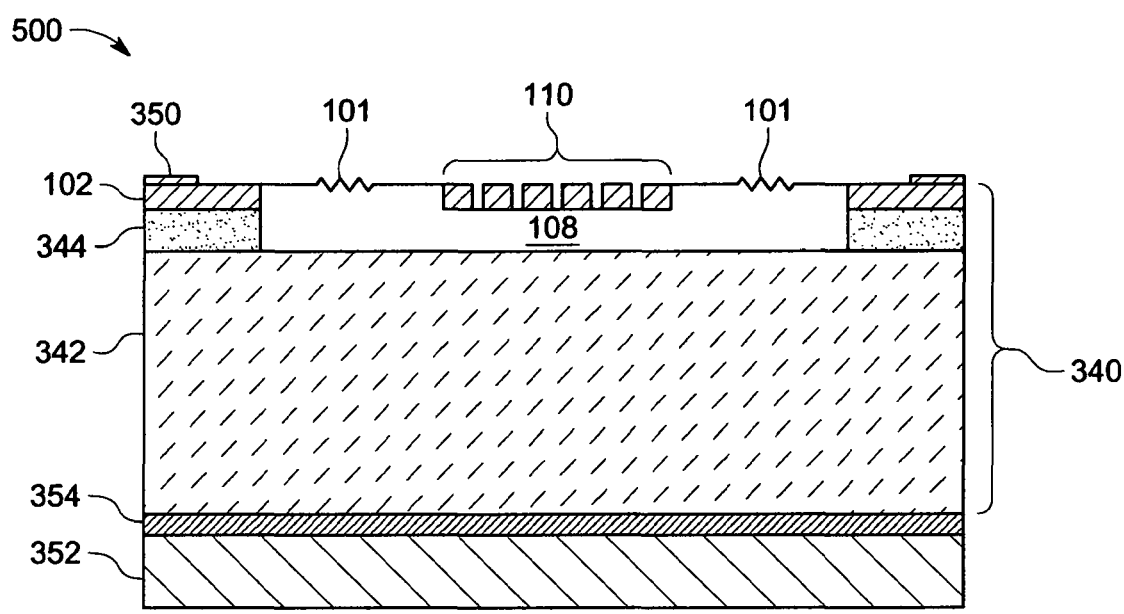
FIG. 5 depicts a cross sectional view of a prior art micro-platform and nanowires released with frontside etch.
Figure 6A:
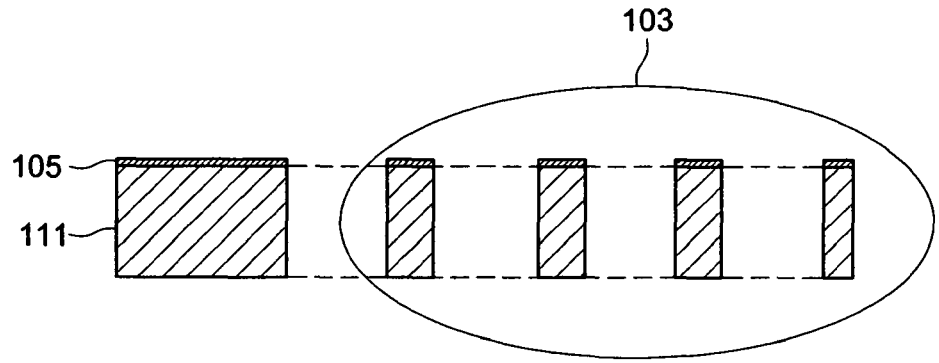
FIGS. 6A, 6B and 6C depict cross-sectional views of a nanowire comprised of two, three and four structural thin films in accordance with the present teachings.
Figure 6B:
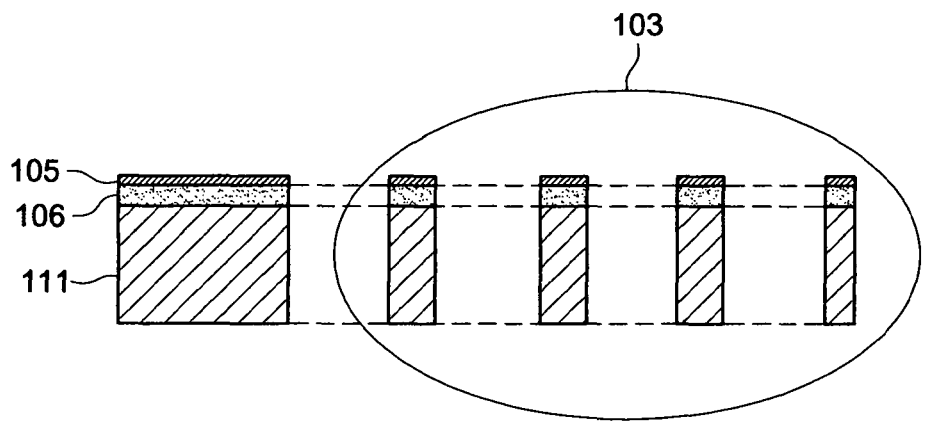
Figure 6C:
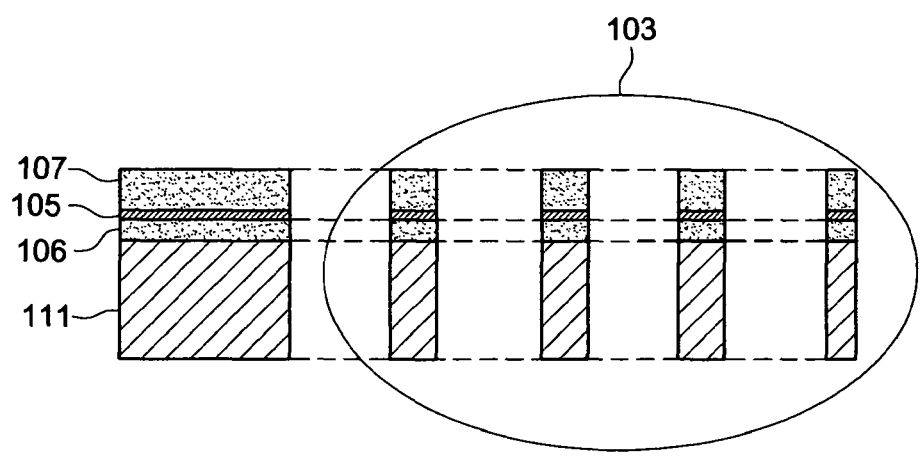
Figure 7:
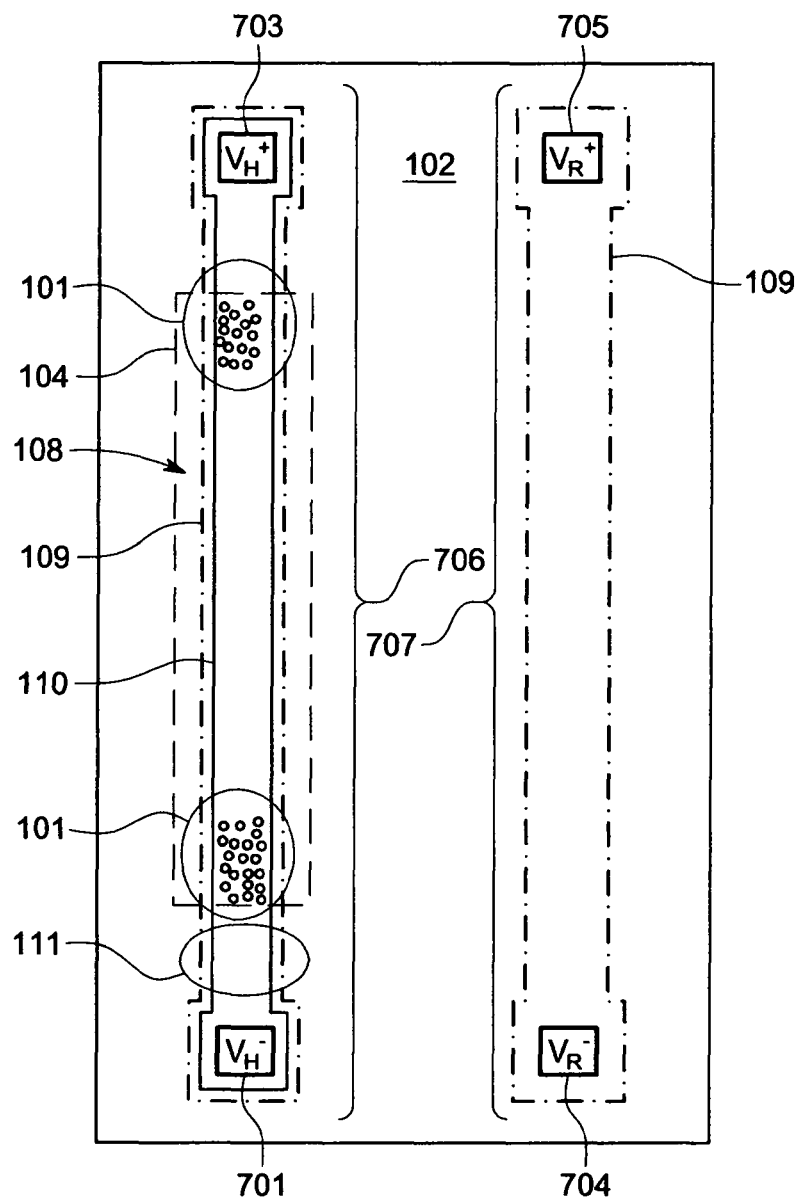
FIG. 7 depicts a plan view of a pixel physically configured with a micro-platform in rectangular format comprised of a semiconductor heater and a thermistor in accordance with the present teachings.

FIG. 18 depicts thermoelectric element 112 of FIG. 1A wherein one FIG. 2A and FIG. 26 depict an embodiment of prior art a nanowires 101 comprising phononic structure 104 FIG. 7 depicts a plan view of a pixel of the present invention comprising a hybrid thermal element. This thermal element comprises a resistive heater 706 operated as a chemiresistive sensor, functioning as both a source of heat and a first thermistor. A second thermistor is disposed in surrounding substrate 102 within the pixel. This exemplary pixel comprises a single micro-platform 109 suspended by nanowires 101 over cavity 108, the cavity surrounded by high resistivity n-type silicon semiconductor substrate layer 102. Substrate 102 comprises the cavity 108 and off-platform thermistor 109. In this exemplary embodiment, substrate 102 comprises the active layer of a starting SOI wafer. The micro-platform 109 and the second thermistor 707 comprise p+ regions created by selective diffusion or boron into the n-type substrate 102. Second thermal element 707 is a thermistor contacted with bonding pads 704, 705. The resistive heater is contacted with bonding pads 701 and 702.

In some embodiments, micro-platform 109 comprises an activation layer or other material sensitive to a gaseous analyte. When exposed to the analyte, temperature of micro-platform 109 changes incrementally and readout is obtained by interrogating the first thermistor. In some other embodiments, the micro-platform comprises only the doped p+ active layer. The second thermistor 707 provides a reference device for environmental temperature.

Figure 8:
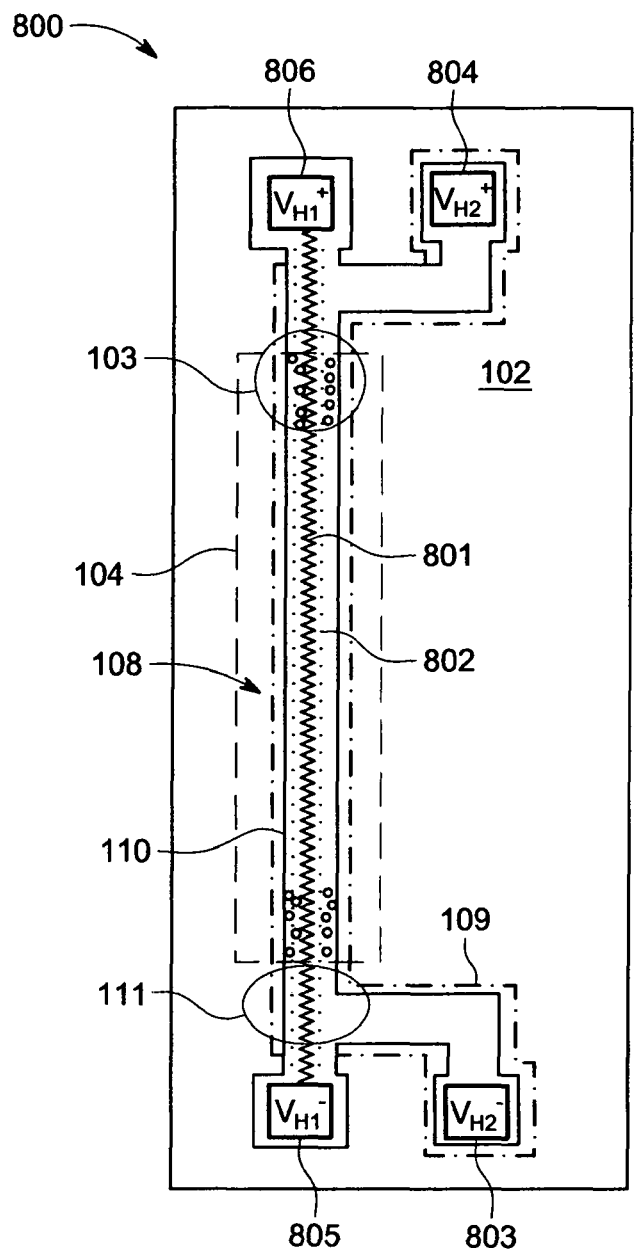
FIG. 8 depicts a plan view of a pixel physically configured with a micro-platform in rectangular format comprised of thin film metal and semiconductor thermal elements in accordance with the present teachings.

FIG. 8 depicts a plan view of the pixel comprised of a single physical thermal element wherein the micro-platform comprises a p+ layer formed from the active layer of the starting SOI wafer and an additional layer of ALD metal sensitive to a gaseous analyte. This exemplary pixel comprises a single micro-platform 110 suspended by nanowires 111 over cavity 108, the cavity surrounded by high resistivity n-type silicon semiconductor substrate 102. Micro-platform 110 is diffused to provide one thermal element 110 and an overlying ALD metal film provides a parallel-connected, second resistive element 801. In embodiments, the two thermal elements are electrically isolated from each other by dielectric film 802. The two thermal elements 801,110 are contacted through bonding pads 805,806 and 803,804 respectively. In embodiments, the thermal element provides mechanical rigidity for the micro-platform comprising an ALD metal film. In some embodiments, the pixel of FIG. 8 is operated as a chemiresistive sensor, wherein the structure 109 contacted to bonding pads 803, 804 comprises a resistive heater, and the ALD metal film 801 is sensitive to an exposed gaseous analyte.

NEW TEXT FIGS. 3 4 5 6B 6C

Figure 9:
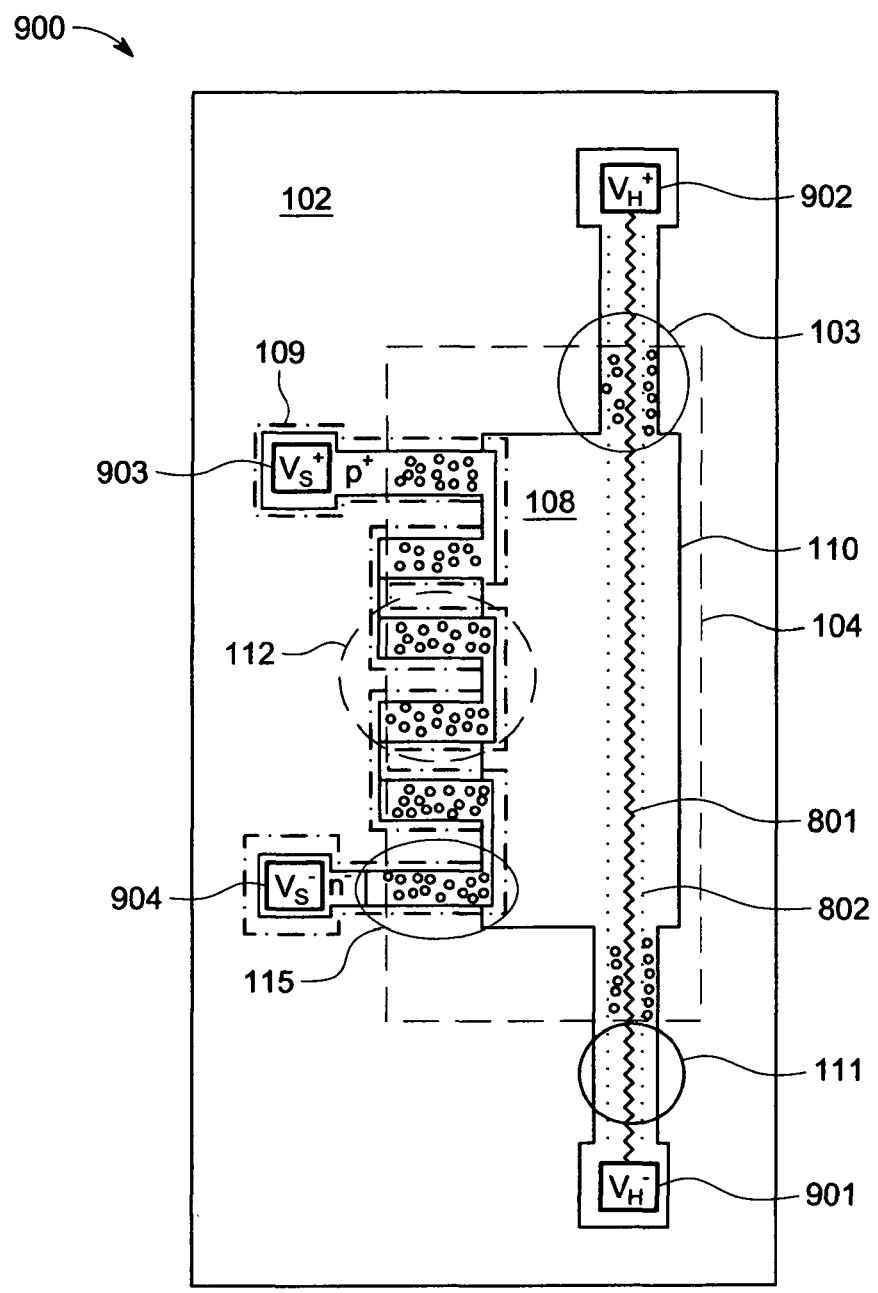
FIG. 9 depicts a pixel physically configured with the micro-platform in a rectangular format comprising a thin film metal heater and a thermoelectric thermal element in accordance with the present teachings.

FIG. 9 depicts a pixel comprising a resistive thermal element and a passive thermal element disposed on the same micro-platform 110. In some embodiments, the resistive thermal element is adapted to operate alone as a hybrid thermal element such as a chemiresistive sensor. In other embodiments, a chemi-resistive sensor is provided with separate thermal elements comprising the heater/ALD activated metal 801 and a Seebeck thermoelectric temperature sensor 112. Thermoelectric sensor 112 provides an additional means for determining micro-platform temperature when exposed to a gaseous analyte. The pixel comprises a single micro-platform 110, further comprising two thermal elements, resistive heater 801 and Seebeck thermoelectric device 112. The micro-platform is disposed over cavity 108 and suspended by nanowires 103,115 the nanowires suspended from surrounding substrate 102. The resistive heater 801 comprises a p+ active layer, and ALD metal layer. Dielectric layer 802 electrically insulates the ALD metal layer 801 from micro-platform 110. A second thermal element is comprised of a plurality of series-connected thermoelectric devices 112 connected through bonding pads 903, 904 disposed on the substrate. Supporting nanowires 115, doped alternatively p+ and n−, are also a component of the Seebeck thermoelectric devices.

Figure 10:
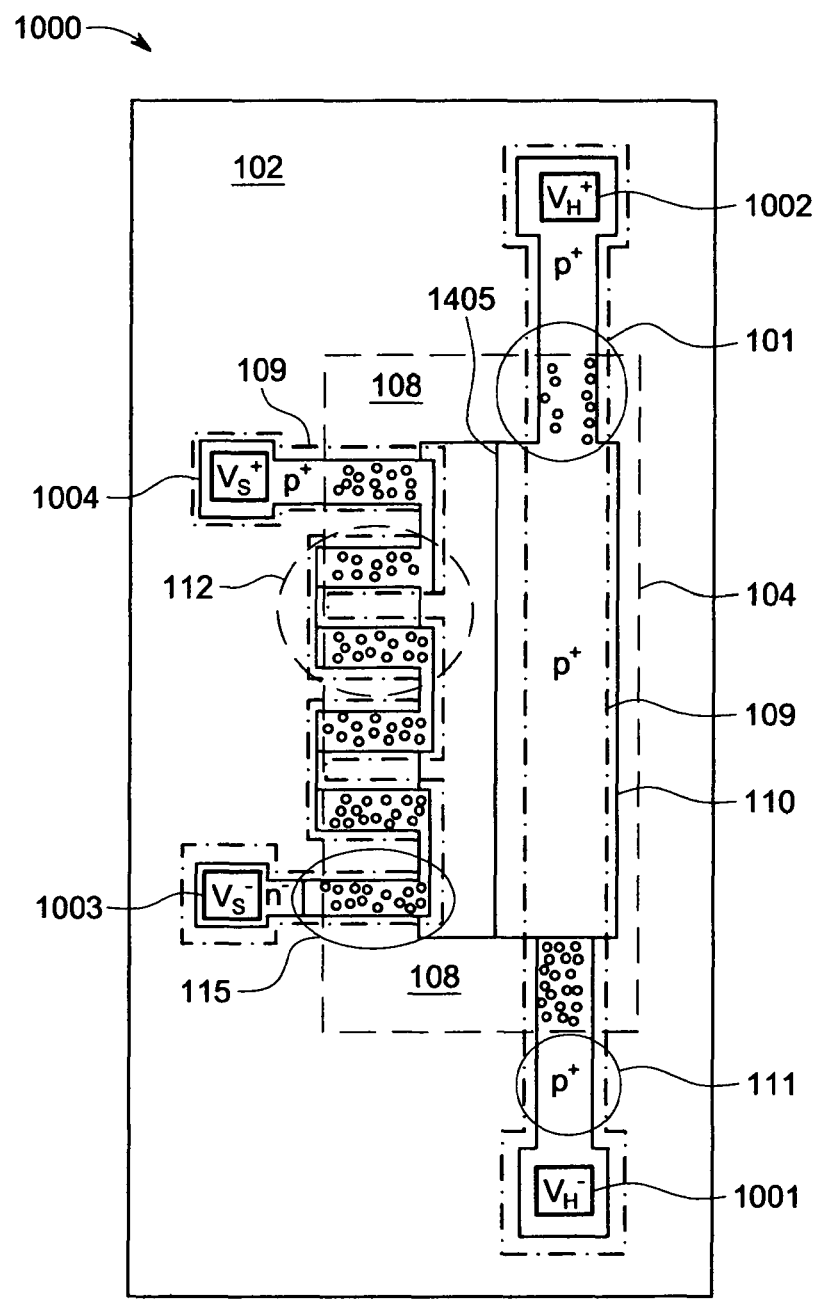
FIG. 10 depicts a pixel physically configured with the micro-platform in a rectangular format with a thermoelectric and a resistive thermal element in accordance with the present teachings.

The pixel depicted in FIG. 10 comprises two thermal elements in a fashion somewhat similar to the embodiment of FIG. 9. An electrostatic shield conductor 1405 patterned as an ALD metal film improves electrical isolation between thermoelectric devices 112 and resistive heater 109. Resistive heater 109 comprises a p+ film diffused into the n− doped micro-platform 110. The electrostatic shield 1405 is connected to the resistive heater 109 at a single point. Micro-platform 110 is suspended by nanowires 101 and 112 over cavity 108 having boundary 104 surrounded by substrate 102. Seebeck thermoelectric devices comprising nanowires 112 are electrically connected to bonding pads 1003, 1004. The thermoelectric device 112 can be operated in either a Seebeck or Peltier thermoelectric mode. In embodiments, the thermoelectric device 109 can be operated as a heating element or as a thermistor. This pixel has application as a material phase-change sensor or hot wire anemometer.

Figure 11:
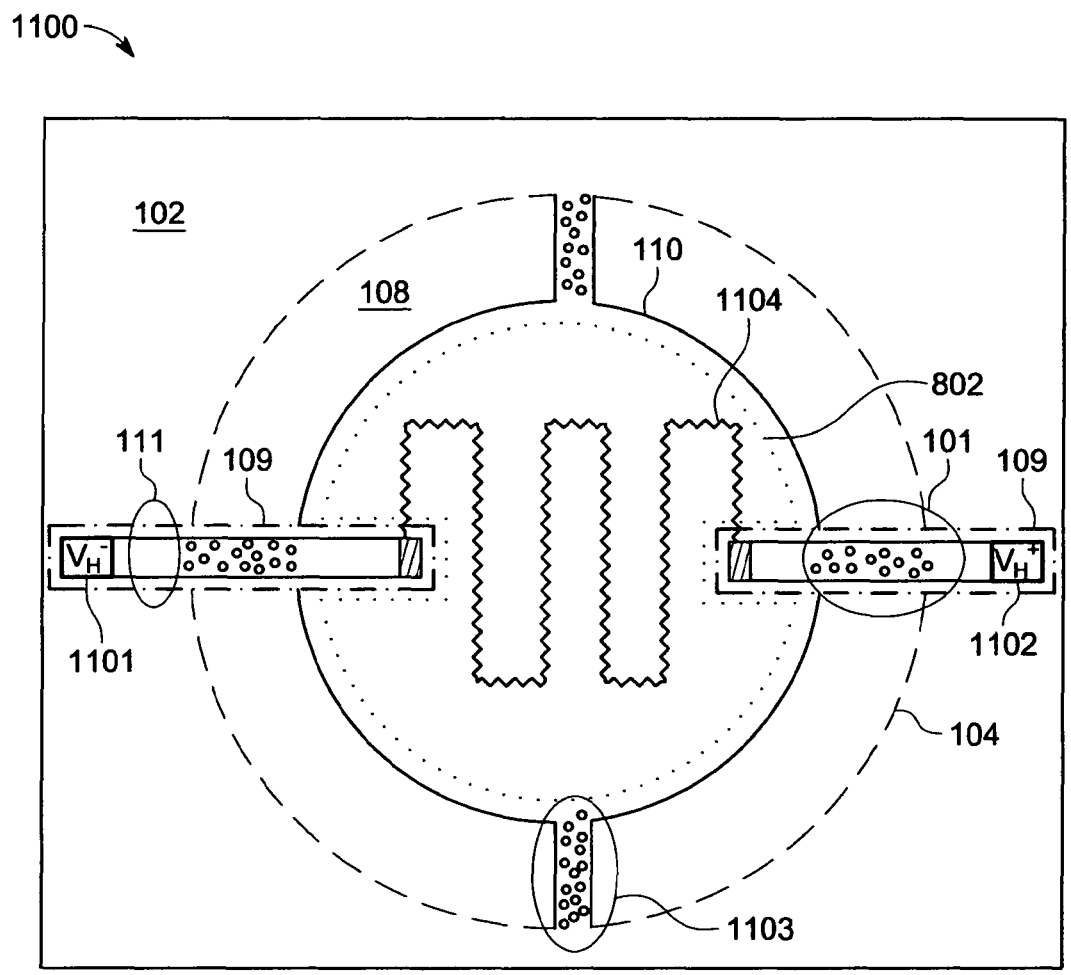
FIG. 11 depicts a pixel with the micro-platform physically configured in a circular format comprised of a serpentine metal heater in accordance with the present teachings.

The pixel depicted in FIG. 11 is comprised of micro-platform 110 in a circular format with a resistive first thermal element 1104 configured as a serpentine ALD film 1104 disposed over dielectric film 802 and connected through nanowires 109, 101 with contacting bonding pads 1101, 1102. The micro-platform is supported by four nanowires indicated as 101, 109 and 1103. The micro-platform 110 and nanowires 101 and 1103 are within cavity 108 having boundary 104, within surrounding support structure 102. Diffused p+ film 109 provides isolation between the thermal elements. ALD metal film 1104 comprises a hybrid thermal element connected between bonding pads 1101, 1102. In embodiments, a resistive second thermal element comprising the micro-platform semiconductor region 110 as an active thermal element is powered through nanowires 1103, heating the micro-platform 110. In some embodiments, this pixel is operated as a single thermal element. This pixel has application as a sensor based on thermal transport dissipating into a gaseous analyte. This pixel can be adapted for application as a chemiresistive sensor, hot wire anemometer, Pirani vacuum sensor, and type 2 pellistor.

Figure 12:
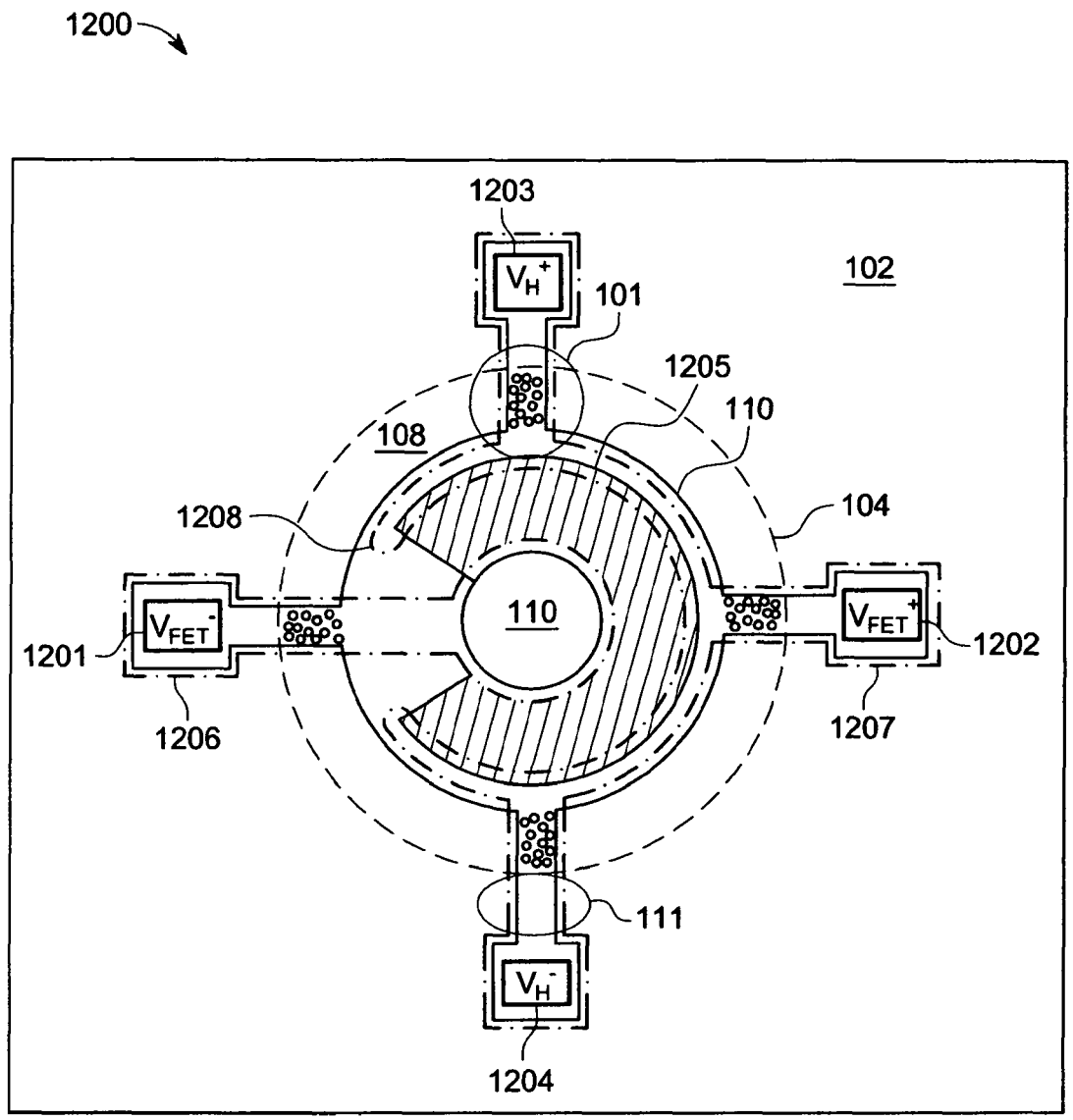
FIG. 12 depicts a chem-FET sensor physically configured in a circular format and comprised of a MOSFET in accordance with the present teachings.

FIG. 12 depicts the pixel comprising a chem-FET sensor in a circular format, the chemFET further comprised of a MOSFET transistor with a floating gate. In some embodiments the gate dielectric 1205 is directed exposed with an analyte and in other embodiments an ALD catalytic film is patterned to cover the gate dielectric. In all embodiments of this pixel, an electric charge collected from the gaseous analyte into the gate dielectric changes the threshold voltage $V_T$ of the MOSFET. The pixel comprises a micro-platform 110 disposed within cavity 108 within boundary 104, the micro-platform supported by nanowires indicated as 101,111 and anchored on surrounding platform 102. The transistor comprises a source diffusion 1206 contacted into bonding pad 1201, drain diffusion contacting into bonding pad 1202, and floating gate 1208. In some embodiments, the ALD film is electrically connected to the high resistivity micro-platform area to provide a path for draining charge from the gate area following an exposure. A resistive conductive path between bonding pads 1203, 1204 connects across the micro-platform through the drain diffusion 1207 further comprising a resistive heater element. This resistive heater element, when powered from an external source, heats the MOSFET and thermally resets the charge distribution within the gate dielectric to a reference level. In some embodiments, a resistive path through the drain diffused area 109 connecting with bonding pads 1203 and 1204 can be operated as a heater thermal element, to reset the MOSFET by outgassing and annealing out surface charge accumulations on the gate dielectric.

Figure 13:
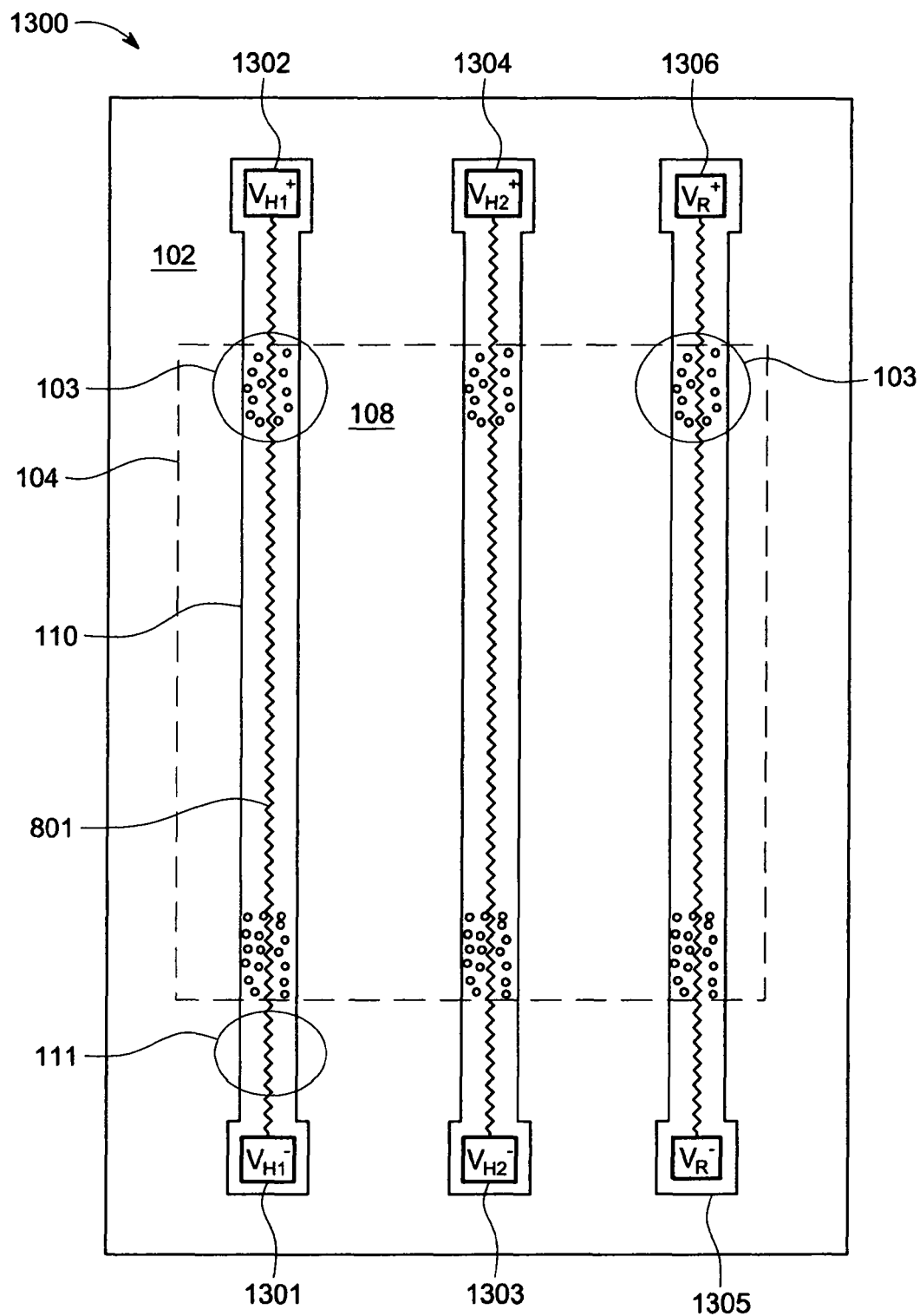
FIG. 13 depicts a pixel physically configured in a rectangular format with multiple micro-platforms having resistive thermal elements disposed over a single cavity in accordance with the present teachings.

The pixel depicted in FIG. 13 is comprised of a cavity having three hybrid thermal elements wherein each thermal element comprises a micro-platform. These three micro-platforms are depicted as a micro-platform comprising ALD metal film 801, the micro-platform suspended over cavity 108 having boundary 104, by nanowires 103, and the nanowires suspended from surrounding substrate 102. The three micro-platforms are each connected with bonding pads within the group 1301 to 1306. In embodiments, each micro-platform may be adapted with the ALD metal film 801 comprising an activation material sensitive to a specific component of an exposed gaseous analyte and operated as a chemi-resistive sensor. In other embodiments, the micro-platform comprises a hybrid thermal element and is operated to sense a physical property of an exposed analyte such as gas pressure and vectored gas flow rate.

Figure 14:
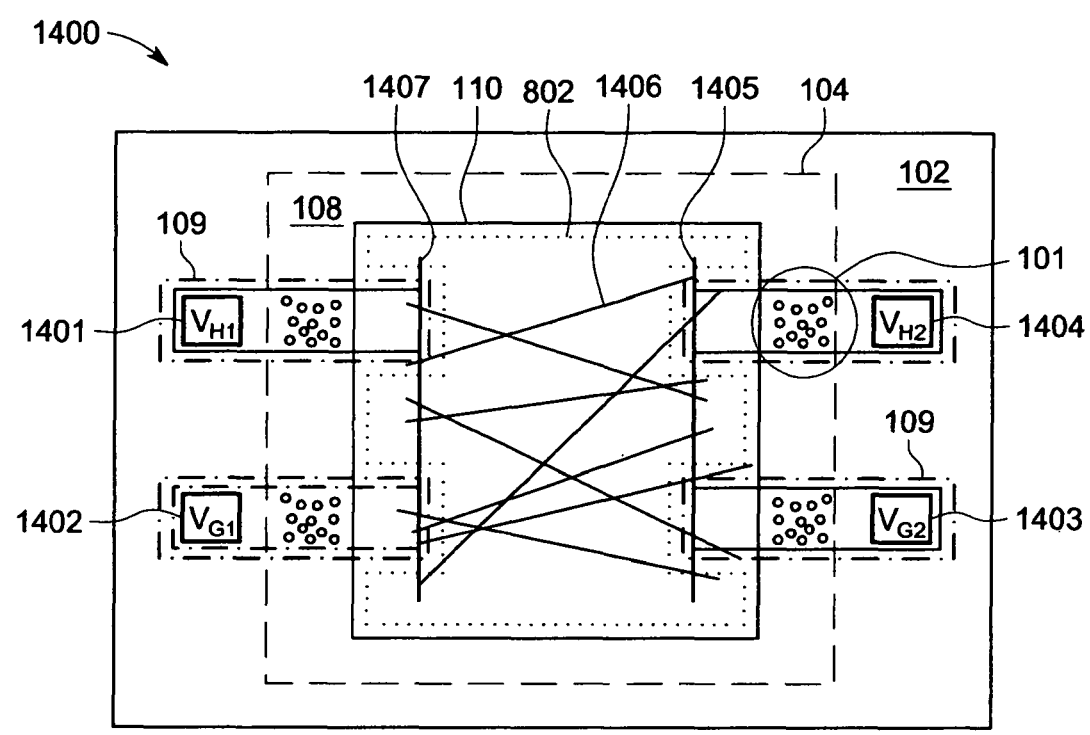
FIG. 14 depicts a pixel with a single micro-platform physically configured with electrodes providing electrical contact with a mesh of sheet graphene or nanotubes. in accordance with the present teachings.

FIG. 14 depicts a pixel with a single micro-platform 110 in a rectangular format configured with spaced electrodes 1405 and a mesh 1406 of sheet graphene or nanotubes comprised of various selected materials including carbon nanotubes. This pixel is typically operated as a chemiresistive sensor. The mesh 1406 provides an electrically conductive path between the two electrodes 1405,1407. The mesh is typically activated with metalorganic atomic-level impurities. The micro-platform 110 is partially covered with dielectric film 802 to reduce the parasitic conduction path between electrodes 1405, 1407. The micro-platform is supported by nanowires 101 over cavity 108 is bounded by perimeter 104 within surrounding substrate 102. In embodiments, sheet graphene, including graphene in rolled sheets, and nanotubes 1406 are disposed in electrical contact with the electrode traces 1405, 1407 and above dielectric film 802. In embodiments, the active semiconductor layer underneath the chemi-resistive sensor material is adapted with electrical contacts to comprise a resistive heater for heating the micro-platform 802. When the graphene or nanotubes are heated independently, the overall long stability of the chemical sensor pixel is enhanced.

Figure 15:
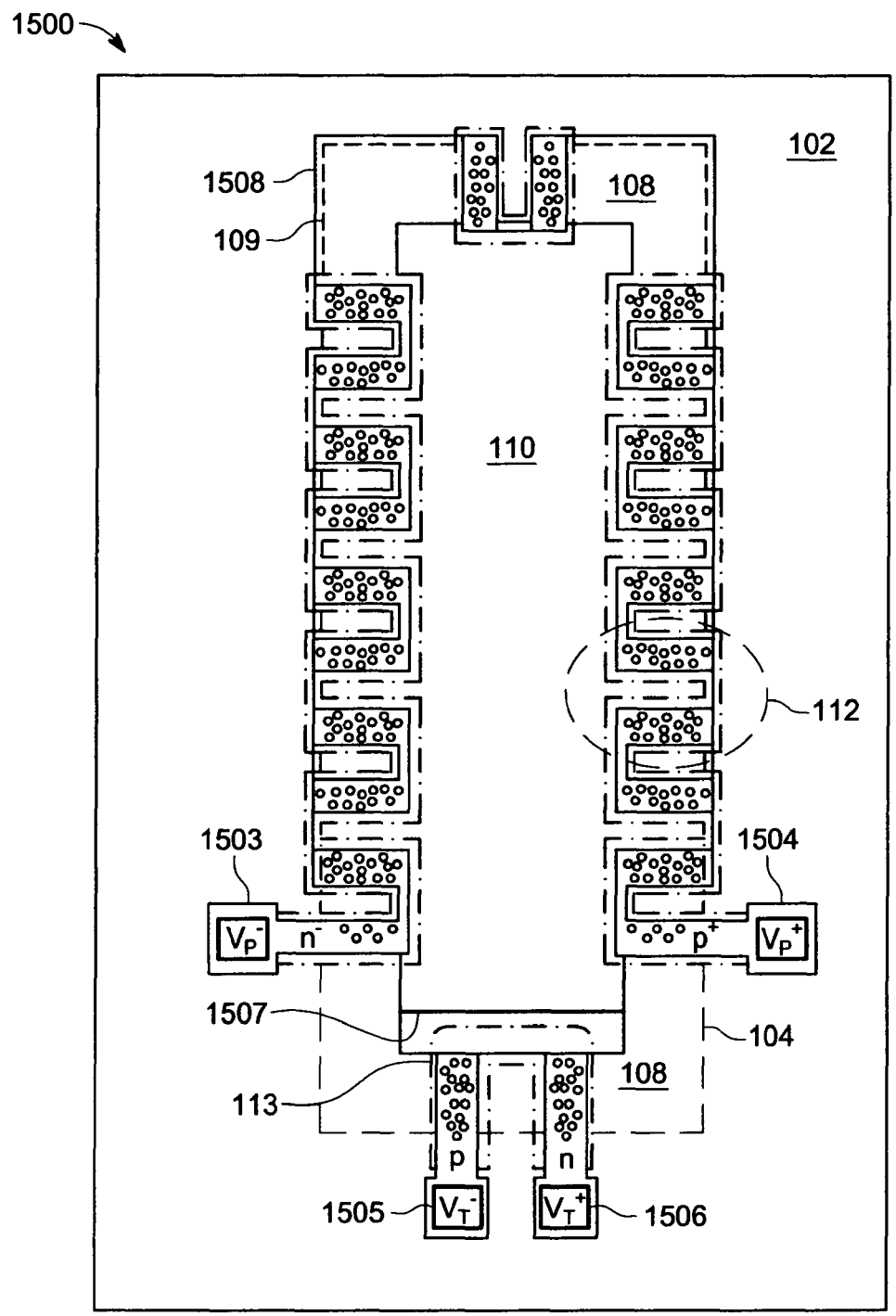
FIG. 15 depicts a pixel physically configured with a single micro-platform comprised of two thermoelectric thermal elements in accordance with the present teachings.

The pixel depicted in FIG. 15 comprises two thermoelectric elements 112, 113, connected between respective bonding pads 1503-1504 and 1505-1506, and disposed on micro-platform 110. In embodiments based on FIG. 15, each thermoelectric device is may be operated in any of three modes: Peltier cooling mode Seebeck sensing mode, and resistive heater mode. In a typical sensing application, however, this pixel is generally operated in only one of the three modes. The two thermoelectric elements of FIG. 15 are electrostatically shielded from each other with ALD metal shield trace 1507 disposed on micro-platform 110. In embodiments, the pixel may be operated in the Peltier cooling mode and cooled to temperatures as low as −100° C. This pixel is adapted in embodiments for operation as a material phase-change sensor including an absolute hygrometer.

Figure 16:
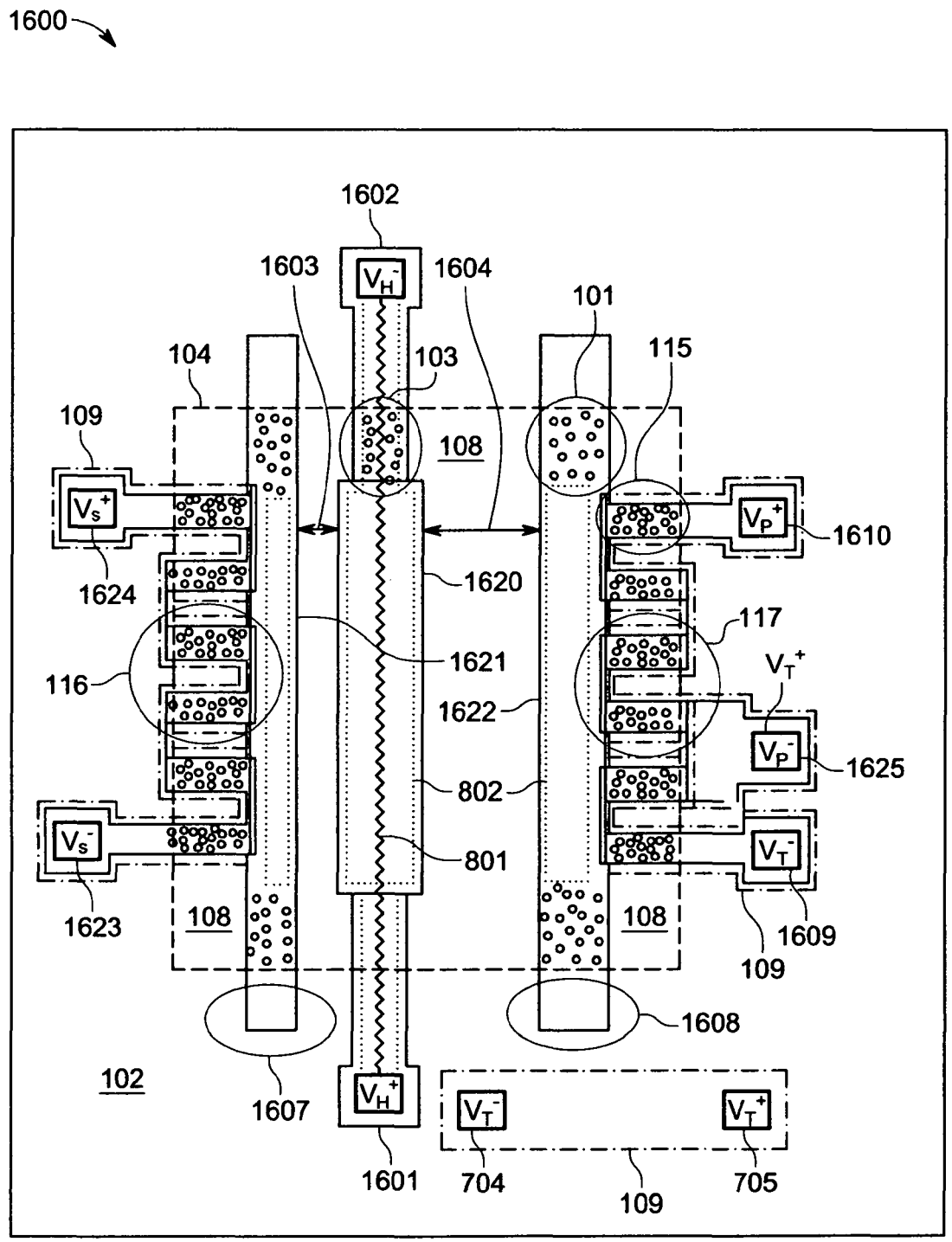
FIG. 16 depicts a pixel comprised of a resistive heater with 2 separately spaced thermoelectric devices in accordance with the present teachings.

FIG. 16 depicts a pixel comprised of three micro-platforms 1620,1621,1622. Centrally-located micro-platform 1620 is typically operated as a resistive heater connected to bonding pads 1601, 1602. Micro-platform 1620 comprises a first thermoelectric device connected with bonding pads 1623, 1624. Micro-platform 1622 comprises a second and third thermoelectric device connected with bonding pads 1609, 1610, 1625, wherein bonding pad 1625 is shared. The micro-platforms are disposed over cavity 108 surrounded by boundary 104 and further within surrounding substrate 102.

The first thermal element 1620 further comprises an ALD metal film 801 disposed over diffused p+ film 802. The two thermoelectric devices 1620, 1622 comprise a series connection of diffused p+ and n− layers. Each doped layer is diffused into the high resistivity active layer of a starting SOI wafer. Thermoelectric micro-platforms 115, 116 are tethered onto substrate 102 at respective tether points 1607,1608. The pixel of FIG. 16 further comprises a thermistor 109 comprising a diffused p+ resistor contacted with bonding pads 704,705. In embodiments, this pixel may be adapted to provide a sensor highly versatile in application, with transduction comprising sensing applications including non-dissipative thermal mass flow, dissipative thermal transport into the analyte, molecular-conducted thermal transport, pressure sensor with extended range, material phase change sensor, chemiresistive sensor, and type 1, 2, and 3 pellistors. In embodiments, thermistor 109, disposed on the substrate 102, is operated to sense environmental temperature of the substrate.

A feature of the pixel of FIG. 16 is differing separations, gap1-1603 and gap2-1604. In embodiments, gap1 is equal to or smaller than the mean free path (mfp) for molecules of the exposed gaseous analyte. For configurations wherein gap1 is less than the mfp, the thermal transport from a heated micro-platform 1620 to micro-platform 1621 is conductive thermal transport. In embodiments, gap2 is greater than the mfp and less than what is required for gravity-affected convective thermal transfer. In embodiments, thermal transfer through gap2 from heated micro-platform 1620 is affected only by forced convective transfer due to moving analyte and with minimal thermal transport by conductive means.

Pixels depicted in FIGS. 7-16 are adapted as sensors in the following examples.

Example 1

Sensor for Molecular-Conducted Thermal Transport (MCTT)

A pixel in accordance with the present teachings can be adapted for use as a sensor for molecular-conducted thermal transport (MCTT). This pixel can be operated as a pressure sensor of extended range with particular application as an atmospheric barometer.

Here the MCTT transduction mechanism comprises thermal transport through the analyte from the heated central platform 1620 to adjacent thermoelectric structures disposed on platforms 1621, 1622. The thermoelectric devices 116, 117 are operated in the Seebeck thermoelectric mode. The analyte exposed to the pixel provides MCTT from central heater micro-platform 1620 onto micro-platform 1621 across gap1 1603 and onto micro-platform 1622 across gap2 1604. Thermal transport across these two gaps is sensitive to the mean free path of air molecules which is directly proportional to pressure of the exposed gaseous analyte which in one embodiment is earth atmosphere.

Barometric pressure changes provide an incremental change in heating via thermal transport to micro-platform 1621. For operation as a barometer, the thermoelectric device 116, connected with bonding pads 1623, 1624 are operated in a passive Seebeck temperature sensing mode with heat provided for gap1 1603 from micro-platform 1620. The increased sensitivity and precision provided by the Seebeck thermoelectric sensor is desirable for the barometer sensor wherein useful sensing range is less than 0.1 bar. A value of barometric pressure is unique for each Seebeck voltage reading at any environmental temperature. Gap1 is useful for sensing pressure level in the range of standard temperature and pressure (STP) for operation as a barometer. It is desirable to configure the pixel with a gap that is less than the mean free path for MCTT when reasonable. The sensitivity of the thermal sensor of micro-platform 1621 to undesirable convective-aided air flow within the pixel is minimal for gap1 dimensions of less than 200 nm at STP.

The pixel of FIG. 16 operated with gap1 and thermoelectric sensor 116 is also useful for higher pressure ranges wherein gap1 is 200 um or less and readout is obtained with Seebeck thermoelectric device 116. The pixel of FIG. 16 is useful for operation as a vacuum pressure sensor wherein gap2 is 500 um or more and readout is obtained with Seebeck thermoelectric device 117.

Example 2

Dissipative Thermal Transport (DTT) Sensor

A pixel in accordance with the present teachings can be adapted for use as a dissipative-thermal transport (DTT) sensor based on the pixels of FIGS. 8, 9,10, 11, 13, 14, and 16 wherein heat from the resistive heater thermal element is dissipated into the exposed gaseous analyte. This dissipation is a type of cooling transduction. In embodiments of this application sensor, a central resistive heater is powered from an external source and temperature of the micro-platform is a function of the rate of heat dissipated into the exposed analyte. This transduction mechanism affects the temperature of the micro-platform comprising the resistive heater. In embodiments, readout of the micro-platform temperature is obtained by driving the resistive heater with a current source and sensing the incremental changes in terminal voltage which is affected by the exposed analyte.

In embodiments, the pixels of FIGS. 8, 10, and 11 can be operated as a hot wire anemometer based on DTT. In embodiments, the pixels of FIGS. 8 and 11 can be operated as a Pirani vacuum sensor based on DTT. In embodiments, the pixels of FIGS. 8 and 9 can be operated as a type 2 pellistor based on DTT.

In embodiments, DTT is the transduction mechanism for pixels of FIGS. 8, 9, 11, 13, and 14 can be operated as a chemiresistive sensor. In embodiments, resistive heater is adapted with an activation film. The activation film is typically a semiconductor of metal oxide semiconductor (MOS) type affecting a change in the electrical conductivity of the thermal element as electrical charges resulting from a chemical reaction shift the Fermi level of the activation film when exposed to a particular analyte. This shift in Fermi level is the result of molecular reactions. In some embodiments, the thermal element is comprised of a catalyst, typically an ALD film or component within an activation film, wherein the catalyst affects the electrical conductivity of the thermal element when exposed to an analyte. In embodiments, the change in electrical conductivity of the thermal element provides a means for modulating the temperature of element when powered from an external current source. MOS activation films include, without limitation, one or more from a group including $WO_3$, $TiO_2$, $In_2O_3$, $CeO_2$ $ZnO_2$, $MoS_2$, $In_2O_3$, $ZnO_2$, $CdS$, $SnO_2$, and $In_xSn_yO_2$. These MOS films are generally wide energy-bandgap semiconductors with a bandgap of more than 2 ev. In embodiments, semiconductor ALD films are further comprised of an impurity, for example a Pd impurity in $SnO_2$ providing sensitivity to $CH_4$ or a La impurity in ZnO providing a sensitivity to $CO_2$.

The activation metal film of the chemiresistive sensor may further comprise catalysts comprised of, without limitation, of one or more of Pd, Pt and Ag as additional ALD film, nanoparticles and flakes. In embodiments, activation films are sensitive to one or more of analytes including $H_2$, CO, $CO_2$, $NH_3$, $H_2S$, $CH_4$, NO, $NO_2$, $BBr_3$ $H_2O_2$, $O_3$ and volatile organic compounds.

In the chemiresistor embodiment of the FIG. 14 pixel, a mesh 1406 of carbon nanotubes, activated with boron and nitrogen is disposed between electrodes 1405, 1407 on micro-platform 110. In this structure, the chemireistor is affected by exposure to the gaseous analyte comprising components such as such as $NO_2$, $NH_3$ and $O_2$. This chemical response is affected as B and N replace carbon atoms in the activated carbon structure. In embodiments, the pixel is configured with an environmental temperature sensor disposed on the substrate and operated for calibration purposes.

Example 3

Non-Dissipative Thermal-Mass Flow Sensor (NDTMF)

A pixel in accordance with the present teachings can be adapted for use as a thermal-mass flow sensor operated as a thermal-mass flow (NDTMF) sensor. Specific sensors, based on NDTMF comprise a vectored flow rate sensor, wherein the vectored flow rate sensor, in embodiments, comprises a vectored spirometer. The TMF sensor comprises three thermal elements exposed to a lateral, cross-flow of the gaseous analyte. The vectored spirometer monitors flowrates for both inhaled and exhaled breath at different times. The NDTMF sensor may be implemented with the pixels of FIGS. 13 and 16.

In an embodiment based on FIG. 13, the pixel is operated as a general purpose a vectored mass flow meter including application as vectored spirometer. In an embodiment based on the pixel of FIG. 13, the vectored flowmeter comprises a central resistive heater with separate temperature sensors disposed on each side of the central resistive heater. In this embodiment, laminar breath flow comprising an analyte is directed over the pixel and in the plane of the pixel. The center thermal element contacted at 1303-1304, is operated as a resistive heater thermal element. The resulting thermal transport of breath over the pixel heats thermistor elements 1301,1302 and 1307,1308 differentially. The differential temperature created between the two thermistors provides an NDTMF means of monitoring the magnitude and direction of breath flow rate across the pixel.

In another embodiment, the pixel of FIG. 16 is operated as a NDTMF sensor further comprising a vectored mass flow meter or spirometer. FIG. 16 provides a spirometer wherein the central micro-platform 1620 is operated as heat source and a differential temperature due to thermal mass movement within breath flow across the pixel is measured with micro-platforms 1621,1622 operated as Seebeck sensors. In embodiments, FIG. 16 is adapted as NDTMF sensor wherein gap1 and gap2 are increased to reduce sensitivity to barometric pressure. For this application, the gap distance is generally more than 300 um.

Example 4

Thermal Chem-FET

In embodiments, the pixel of FIG. 12 is operated as a passive thermal element comprising a chem-FET. The transduction mechanism within the chemFET sensor involves catalytic conversion of hydrogen from a component of the exposed gas or vapor analyte into atomic hydrogen (Ha), wherein the Ha creates an electric charge within the gate dielectric of a MOSFET transistor. In the chem-FET sensor embodiment, the conductance of the MOSFET channel is affected upon exposure to the analyte. The chemFET is operational at room temperature. The gate charge level, following a series of sensing operations, is reset to a reference channel conductance level by powering the active heating element with connections 1203,1204 disposed on the micro-platform.

Example 5

Exothermic Chemical Reaction Sensor

A pixel in accordance with the present teachings can be adapted for as use a pellister wherein sensing is based on exothermic chemical reaction (ECR) sensing of a component of the gaseous analyte. Embodiments comprise a type 1 pellistor having two thermal elements and a type 2 pellistor comprising a single thermal elements. The ECR transduction mechanism for the type 1 and type 2 pellistor is based on heating the micro-platform with an external power source to a high enough temperature, oxidizing a component within the exposed analyte. In addition, the pellistor is generally comprised of palladium which spontaneously provides additional heat from the exothermic reaction.

A type 1 pellister comprises two separate thermal elements on the same micro-platform, wherein an active thermal element comprises the resistive heater and a passive thermal element comprises a temperature sensor. The temperature sensor of the type 1 pellister may comprise a thermistor or a Seebeck thermoelectric device. The pixel of FIGS. 11, 13 and 16 can be adapted wherein the micro-platform comprises an ALD metal film further comprised of palladium.

A type 2 pellister comprises a single thermal element operated to provide both a resistive heater and temperature sensor. The type 2 pellister is operated as a bolometer to obtain readout of micro-platform temperature and accompanying measure of flammable component within the exposed analyte. The pixel of FIGS. 8, 11, and 16 may be operated as a type 2 pellister wherein a micro-form comprises an ALD metal film further comprising palladium. This embodiment is used to detect explosive gases within an oxygen ambient including earth atmosphere.

Example 7

Material Phase-Change Sensor

A pixel in accordance with the present teachings can be adapted for use as a material phase-change (MPC) sensor wherein the phase change is controlled by temperature of the micro-platform (as with freezing ice) or wherein the temperature of the micro-platform is increased by a spontaneous chemical reaction of the ALD metal in the micro-platform (as with a type 3 pellistor).

Figure 17:
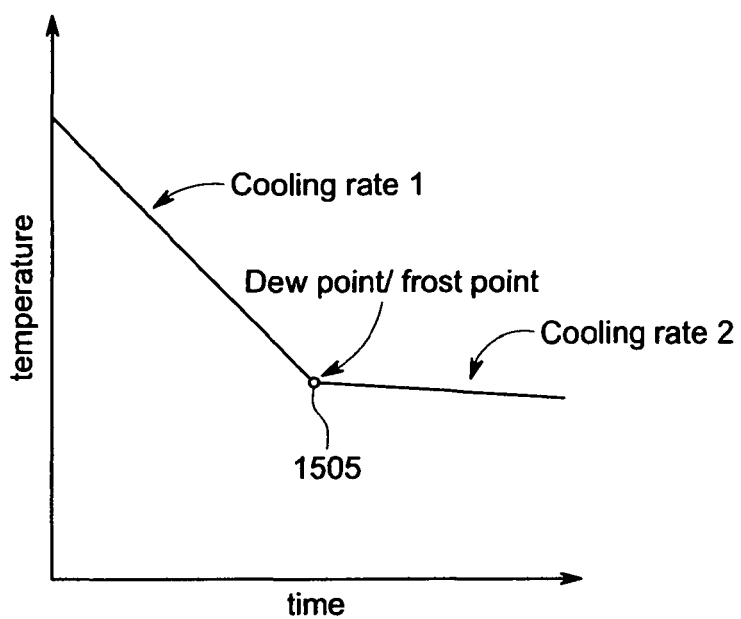
FIG. 17 is a graph depicting operation of the absolute hygrometer wherein the micro-platform temperature is cooled through the dew point or frost point temperature of the exposed analyte in accordance with the present teachings.

An example of the MPC sensor is an absolute hygrometer. In this embodiment, MPC is monitored versus time to monitor the rate of cooling of a cooled micro-platform exposed analyte. In this case, MPC occurs as water freezes or thaws. Transduction is based on the fact that water creates a heat of fusion as it freezes into ice. The opposite effect occurs as ice melts. The rate of cooling of a cooled micro-platform changes fairly abruptly as cooling proceeds to create frost or ice. Dewpoint temperature may be above or below 0° C. This cooling time transient depicted in FIG. 17 identifies dewpoint and frost/freezing point in embodiments wherein the pixel of FIGS. 15 and 16 are operated to provide an absolute hygrometer. In some operations, the temperature transient of FIG. 17 is obtained as both cooling rate and heating rate as the micro-platform is temperature cycled below and above frostpoint temperature. The MPC sensor provides much more thermal information than prior art sensors such as the sling psychometer. The MPC sensor permits correction for errors due to the Mpemba effect in prior art hygrometers.

In embodiments, MPC is monitored with the pixel of FIG. 15, wherein the thermoelectric device 112 is operated as a Peltier cooler, temperature of the micro-platform 110 is monitored over time with thermoelectric device 113 operated as a Seebeck temperature sensor. The micro-platform 110 temperature can also be monitored for thawing and spontaneous or heating from thermal element 112 to complete a hysteresis loop. Operation of the pixel over a wide temperature range including cooling to temperatures well below freezing provides a database over an extended range of temperature. The thermal transient comprises a database that can be processed with an appropriate calibration algorithm to obtain an accurate determination of dewpoint and frost point temperature more accurate than has been available from prior absolute hygrometers. The absolute hygrometer provides a measure of relative humidity when referred to an environmental temperature ambient. Ambient temperature for the gaseous analyte is provided by a temperature sensor, generally a thermistor or bandgap diode disposed on the substrate.

In embodiments, platform 1621 of the FIG. 16 pixel can also be operated to provide an absolute hygrometer based on MPG wherein micro-platform 1621 is cooled by Peltier thermoelectric device 116 and the platform temperature is monitored by thermal element 1621 operated as a thermistor. Thermal element 1621 can also be operated as a resistive heater to provide a heating transient for the platform. This embodiment provides a convenient means wherein the micro-platform is temperature cycled over a wide range from well below frost temperature to well above frost temperature.

Another example of the MPC sensor is a type 3 pellistor. An exemplary embodiment is obtained with the pixel of FIG. 9 by adapting the ALD metal film with palladium to provide a source of heat and sensing micro-platform 110 temperature with thermoelectric element 112 operated as a Seebeck sensor. The heated ALD film 801 comprised of palladium or palladium alloy spontaneously adsorbs hydrogen from a component of the gaseous analyte at room temperature, incrementally increasing temperature of micro-platform 110. The transduction mechanism is a spontaneous MPC within the palladium component of ALD metal film 801.

Example 8

Integrated Biomedical Breath Analyzer

A pixel in accordance with the present teachings the pixel of FIG. 13 can be and can be adapted for operation as an integrated biomedical breath analyzer (IBBA) comprising a vectored-flow spirometer and a capnometer. In embodiments, the pixel of FIG. 13 is adapted to comprise additional micro-platforms, as many as two dozen or more. Three of the micro-platforms are operated as a vectored spirometer wherein the gaseous analyte comprises breath flow across the three micro-platforms. A centrally-disposed micro-platform is a resistive heater, active thermal element. A thermistor is disposed on each side of the resistive heater to provide a differential sensor. The differential temperature sensed by the two thermistors is proportional to vectored breath flowrate. In this IBBA embodiment, each of the remaining micro-platforms comprise a chemiresistive sensor, wherein each chemiresistive sensor is responsive to a molecular component of breach, including, without limitation $CO_2$, $NH_3$, $H_2$, $H_2S$, $NH_3$, NO, and volatile vapors including $C_2H_{40}$, $C_3H_{60}$ and $C_7H_8$. Sensing these molecular components of breath is useful for detecting and evaluating certain diseases. In one IBBA embodiment, a capnometer sensing $CO_2$ is provided by activating one of the chemiresistive sensors with an ALD film comprising semiconductor ZnO(La). In another IBBA embodiment, the chemiresistive sensor is activated with $SnO_2$, in various forms including nanotubes, to provide sensitivity to a breath component $H_2$.

Example 9

Integrated Sensor for Weather and Environmental Monitoring

In accordance with the present teachings, pixels of FIGS. 13 and 15 can be adapted as an integrated sensor for weather and environmental monitoring. In embodiments, the substrate is adapted with multiple platforms, as many as two dozen micro-platforms within a single cavity to provide a barometer, absolute hygrometer, hot wire anemometer, chemiresistor sensor and environmental thermometer. In this embodiment, earth atmosphere is the gaseous analyte. In embodiments, micro-platforms depicted in FIGS. 13 and 15 are disposed within a single cavity and operated as said environmental sensors.

The chemi-resistive sensors of FIG. 13, disposed within the cavity in any number, comprise ALD films each sensitive to an environmental component of interest. In embodiments, the number of chemiresistive sensors 801 disposed within cavity 108 can be increased substantially. Each chemiresistive sensor is sensitive to a component of earth atmosphere, including, but without limitation, CO, $CO_2$, NO, $NO_2$, $NH_3$, $H_2S$, $CH_4$. In some other embodiments, a micro-platform comprises a type 2 pellistor sensitive to flammable vapors including natural gas and methane.

Two micro-platforms 1620, 1621 within the pixel of FIG. 16 are adapted and operated as an MCTT barometer. The micro-platform 1621 can be operated as an MPC sensor, configured as an absolute hygrometer, to provide a sensor for relative humidity referenced to environmental atmospheric temperature. Environmental temperature is sensed by a temperature sensor, typically a thermistor or bandgap diode, disposed on the substrate. The hot wire anemometer comprises one micro-platform and is operated as a DTT sensor. The hot wire anemometer is calibrated at environmental temperatures in a laboratory wind tunnel.

It is to be understood that although the disclosure teaches many examples of embodiments in accordance with the present teachings, many additional variations of invention can easily be devised by those skilled in the art after reading this disclosure. As a consequence, the scope of the present invention is to be determined by the following claims.

The invention claimed is:

1. An apparatus comprising a pixel for thermal transport and/or electrical impedance sensing, wherein the pixel comprises:
    a substrate having a substantially planar surface;
    a cavity formed from the substrate;
    a micro-platform comprising at least one thermal element, the micro-platform disposed within the cavity, the micro-platform suspended by nanowires, the nanowires suspended from the substrate,
    and further wherein:
        the micro-platform and the nanowires are disposed substantially within the same plane;
        one or more of the nanowires is comprised of a first layer, the first layer comprised of scattering phononic structure and/or resonant phononic structure, wherein the scattering phononic structure and/or resonant phononic structure reduces thermal conductivity in the first layer;
        the first layer is further comprised of a semiconductor, wherein the semiconductor provides electrical conductivity in the first layer;
        the scattering phononic structure comprises random or periodic array of scattering sites (SS), the scattering sites separated by distances less than the mean-free-path of heat-conducting phonons;
        the resonant phononic structure comprises phononic crystal (PnC), wherein the PnC comprises a periodically-patterned array having a phononic bandgap, the phononic bandgap impedes the movement of heat transporting phonons within a range of frequencies; and
        the at least one thermal element, upon exposure to a gaseous analyte, is affected by a physical characteristic or chemical characteristic of the gaseous analyte.

2. The apparatus of claim 1 wherein the scattering phononic structure and/or resonant phononic structure is an array comprising one or more of holes, pillars, plugs, cavities, indentations, implanted elemental species and embedded particulates.

3. The apparatus of claim 1 wherein the one or more nanowires comprised of the first layer is further comprised of a second layer, the second layer comprising an ALD metal, and further wherein the second layer increases electrical conductivity for the one or more nanowires comprised of the first layer.

4. The apparatus of claim 1 wherein one or more of the nanowires comprised of the first layer is further comprised of a third layer, the third layer comprising an ALD dielectric film, and further wherein the third layer provides one or more of an electrical isolation between layers, interlayer stress relief, passivation against process-etch species and surface passivation to reduce surface state trapping of current-carrying charge carriers.

5. The apparatus of claim 1 wherein the pixel is adapted to comprise a plurality of the cavity and/or a plurality of the micro-platform within one or more cavities.

6. The apparatus of claim 1 wherein the thermal element comprises one or more of a thermocouple device, thermistor or bolometer, chemiresistive sensor, pellistor, nanotubes or graphene, chem-FET, bandgap diode, MOS transistor and bipolar transistor.

7. The apparatus of claim 1 wherein the at least one thermal element provides a source of heat and comprises a resistive ALD metal film, a semiconductor film or a pellistor.

8. The pellistor of claim 7 heated to enable an exothermic chemical reaction within the exposed gaseous analyte, or spontaneously undergoing an internal phase change when exposed to the gaseous analyte.

9. The apparatus of claim 1 wherein the one or more thermal elements disposed on the micro-platform comprise a resistive heater, the resistive heater powered to achieve an elevated temperature, the elevated temperature enabling outgassing of adsorbed gaseous components of the analyte from the surface of the micro-platform, thereby resetting response of the thermal elements to a previous level.

10. The apparatus of claim 1 wherein the one or more thermal elements comprise a single thermoelectric structure, and the thermoelectric structure is operated, at different times, to provide one or more of thermal functions including (1) Peltier cooling wherein the thermoelectric structure is operated as a Peltier device having power supplied by an external electrical source, (2) resistive heating, wherein power is supplied from an external electrical source of reversed polarity, and (3) temperature sensing, wherein the thermoelectric structure is operated as a passive Seebeck device.

11. The apparatus of claim 1 wherein the apparatus comprises a chemiresistive sensor further comprised of one or more of an activation material, catalyst and nanotubes, the chemi-resistive sensor powered from an external power source, the chemi-resistive sensor operational with thermal transport dissipating heat into the gaseous analyte, and further wherein the resistance of the chemiresistive sensor is affected by exposure to the gaseous analyte.

12. The apparatus of claim 11 adapted with a plurality of addressable chemiresistive sensors, the plurality of chemiresistive sensors disposed within a single cavity or disposed within an array of cavities.

13. The apparatus of claim 11 comprising a biomedical breath analyzer wherein the gaseous analyte is expired breath, the analyzer comprising one or more chemiresistive sensors, each chemiresistive sensor sensitive to a component of the gaseous analyte, and further comprising a spirometer.

14. The apparatus of claim 1 wherein the micro-platform comprises a chem-FET sensor, the chem-FET readout obtained with an interrogation current or voltage source, and further wherein the channel resistance of the chem-FET is affected by exposure of the ALD gate-electrode or gate-dielectric to the gaseous analyte.

15. The apparatus of claim 1 wherein the apparatus is a sensor for molecular-conducted thermal transport between two thermal elements comprising one or more of a barometer, vacuum gauge, or extended-range pressure gauge.

16. The apparatus of claim 1 wherein the apparatus is a material phase change sensor wherein the thermal element undergoes a change in quasi-crystalline structure, freezes or boils when exposed to the gaseous analyte.

17. The apparatus of claim 1 wherein the apparatus is a dissipative thermal transport sensor comprising a hot wire anemometer or a Pirani vacuum gauge sensor, said sensors powered to an elevated temperature from an external source, temperature of the micro-platform is affected by the exposed gaseous analyte, and wherein electrical resistance of said sensors provides a thermistor for signal readout.

18. The apparatus of claim 1 wherein the apparatus is a non-dissipative thermal-mass flow sensor, the gaseous analyte mass transporting heat from a centrally-disposed, heated resistive heater to one or more temperature sensors, and further wherein the signal from the one or more temperature sensors is a measure of lateral flowrate for the gaseous analyte.

19. The apparatus of claim 1 further comprising at least one sensor selected from the group consisting of a hot wire anemometer, thermal-mass flow sensor, atmospheric barometer, Pirani vacuum gauge, absolute hygrometer, extended-range pressure gauge, vectored spirometer, capnometer, pellistor and chemiresistive sensor.

* * * * *